(12) United States Patent
Katz et al.

(10) Patent No.: US 8,467,249 B2
(45) Date of Patent: *Jun. 18, 2013

(54) SYSTEMS AND METHODS FOR STORING, RETRIEVING, AND ADJUSTING READ THRESHOLDS IN FLASH MEMORY STORAGE SYSTEM

(75) Inventors: Michael Katz, Haifa (IL); Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 89 days.

This patent is subject to a terminal disclaimer.

(21) Appl. No.: 13/173,145

(22) Filed: Jun. 30, 2011

(65) Prior Publication Data

US 2012/0008401 A1   Jan. 12, 2012

Related U.S. Application Data

(60) Provisional application No. 61/361,626, filed on Jul. 6, 2010.

(51) Int. Cl.
*G11C 16/04* (2006.01)
(52) U.S. Cl.
USPC ........... 365/185.18; 365/185.02; 365/185.04; 365/185.24
(58) Field of Classification Search
USPC .............. 365/185.18, 185.24, 185.02, 185.04
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |

(Continued)

FOREIGN PATENT DOCUMENTS

| | | |
|---|---|---|
| WO | WO 2009/053963 | 4/2009 |
| WO | WO 2009/072101 | 6/2009 |
| WO | WO 2009/072102 | 6/2009 |

OTHER PUBLICATIONS

Search Report of PCT Patent Application WO 2009/118720 A3.

(Continued)

*Primary Examiner* — Pho M Luu
(74) *Attorney, Agent, or Firm* — Dentons US LLP

(57) ABSTRACT

A method, system and computer-readable medium are provided for reading information from a memory unit. A request may be received to read information from a set of memory cells in the memory unit. At least one read threshold in an initial set of read thresholds may be perturbed to generate a perturbed set of read thresholds. The set of memory cells may be read using the perturbed set of read thresholds to provide a read result. The performance of said reading may be evaluated using the perturbed set of read thresholds. The at least one read threshold may be iteratively perturbed for each sequential read operation that the read performance is evaluated to be sub-optimal.

43 Claims, 25 Drawing Sheets

U.S. PATENT DOCUMENTS

| | | | |
|---|---|---|---|
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,370,061 B1 | 4/2002 | Yachareni et al. | |
| 6,374,383 B1 | 4/2002 | Weng | |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |
| 6,560,747 B1 | 5/2003 | Weng | |
| 6,637,002 B1 | 10/2003 | Weng et al. | |
| 6,639,865 B2 | 10/2003 | Kwon | |
| 6,674,665 B1 | 1/2004 | Mann et al. | |
| 6,704,902 B1 | 3/2004 | Shinbashi et al. | |
| 6,725,321 B1 * | 4/2004 | Sinclair et al. | 711/103 |
| 6,751,766 B2 | 6/2004 | Guterman et al. | |
| 6,772,274 B1 | 8/2004 | Estakhri | |
| 6,781,910 B2 | 8/2004 | Smith | |
| 6,792,569 B2 | 9/2004 | Cox et al. | |
| 6,873,543 B2 | 3/2005 | Smith et al. | |
| 6,891,768 B2 | 5/2005 | Smith et al. | |
| 6,914,809 B2 | 7/2005 | Hilton et al. | |
| 6,915,477 B2 | 7/2005 | Gollamudi et al. | |
| 6,952,365 B2 | 10/2005 | Gonzalez et al. | |
| 6,961,890 B2 | 11/2005 | Smith | |
| 6,990,012 B2 | 1/2006 | Smith et al. | |
| 6,996,004 B1 | 2/2006 | Fastow et al. | |
| 6,999,854 B2 | 2/2006 | Roth | |
| 7,010,739 B1 | 3/2006 | Feng et al. | |
| 7,012,835 B2 | 3/2006 | Gonzalez et al. | |
| 7,038,950 B1 | 5/2006 | Hamilton et al. | |
| 7,068,539 B2 | 6/2006 | Guterman et al. | |
| 7,079,436 B2 | 7/2006 | Perner et al. | |
| 7,149,950 B2 | 12/2006 | Spencer et al. | |
| 7,177,977 B2 | 2/2007 | Chen et al. | |
| 7,191,379 B2 | 3/2007 | Adelmann et al. | |
| 7,196,946 B2 | 3/2007 | Chen et al. | |
| 7,203,874 B2 | 4/2007 | Roohparvar | |
| 7,290,203 B2 | 10/2007 | Emma et al. | |
| 7,292,365 B2 | 11/2007 | Knox | |
| 7,301,928 B2 | 11/2007 | Nakabayashi et al. | |
| 7,441,067 B2 | 10/2008 | Gorobets et al. | |
| 7,466,575 B2 | 12/2008 | Shalvi et al. | |
| 7,533,328 B2 | 5/2009 | Alrod et al. | |
| 7,558,109 B2 | 7/2009 | Brandman et al. | |
| 7,593,263 B2 | 9/2009 | Sokolov et al. | |
| 7,697,326 B2 | 4/2010 | Sommer et al. | |
| 7,706,182 B2 | 4/2010 | Shalvi et al. | |
| 7,804,718 B2 | 9/2010 | Kim | |
| 7,805,663 B2 | 9/2010 | Brandman et al. | |
| 7,805,664 B1 | 9/2010 | Yang et al. | |
| 7,843,732 B2 * | 11/2010 | Lee et al. | 365/185.09 |
| 7,844,877 B2 | 11/2010 | Litsyn et al. | |
| 7,961,797 B1 | 6/2011 | Yang et al. | |
| 8,009,472 B2 * | 8/2011 | Murin et al. | 365/185.03 |
| 8,020,073 B2 | 9/2011 | Emma et al. | |
| 8,122,328 B2 | 2/2012 | Liu et al. | |
| 2002/0063774 A1 | 5/2002 | Hillis et al. | |
| 2002/0085419 A1 | 7/2002 | Kwon et al. | |
| 2002/0154769 A1 | 10/2002 | Petersen et al. | |
| 2003/0065876 A1 | 4/2003 | Lasser | |
| 2003/0101404 A1 | 5/2003 | Zhao et al. | |
| 2003/0105620 A1 | 6/2003 | Bowen | |
| 2003/0192007 A1 | 10/2003 | Miller et al. | |
| 2004/0015771 A1 | 1/2004 | Lasser et al. | |
| 2004/0030971 A1 | 2/2004 | Tanaka et al. | |
| 2004/0153722 A1 | 8/2004 | Lee | |
| 2004/0153817 A1 | 8/2004 | Norman et al. | |
| 2004/0181735 A1 | 9/2004 | Xin | |
| 2005/0013165 A1 | 1/2005 | Ban | |
| 2005/0018482 A1 | 1/2005 | Cemea et al. | |
| 2005/0083735 A1 | 4/2005 | Chen et al. | |
| 2005/0117401 A1 | 6/2005 | Chen et al. | |
| 2005/0120265 A1 | 6/2005 | Pline et al. | |
| 2005/0128811 A1 | 6/2005 | Kato et al. | |
| 2005/0138533 A1 | 6/2005 | Le-Bars et al. | |
| 2005/0144213 A1 | 6/2005 | Simkins et al. | |
| 2005/0144368 A1 | 6/2005 | Chung et al. | |
| 2005/0169057 A1 | 8/2005 | Shibata et al. | |
| 2005/0172179 A1 | 8/2005 | Brandenberger et al. | |
| 2005/0213393 A1 | 9/2005 | Lasser | |
| 2006/0059406 A1 | 3/2006 | Micheloni et al. | |
| 2006/0059409 A1 | 3/2006 | Lee | |
| 2006/0064537 A1 | 3/2006 | Oshima et al. | |
| 2006/0101193 A1 | 5/2006 | Murin | |
| 2006/0203587 A1 | 9/2006 | Li et al. | |
| 2006/0221692 A1 | 10/2006 | Chen | |
| 2006/0248434 A1 | 11/2006 | Radke et al. | |
| 2006/0268608 A1 | 11/2006 | Noguchi et al. | |
| 2006/0294312 A1 | 12/2006 | Walmsley | |
| 2007/0025157 A1 | 2/2007 | Wan et al. | |
| 2007/0063180 A1 | 3/2007 | Asano et al. | |
| 2007/0103992 A1 | 5/2007 | Sakui et al. | |
| 2007/0104004 A1 | 5/2007 | So et al. | |
| 2007/0109858 A1 | 5/2007 | Conley et al. | |
| 2007/0124652 A1 | 5/2007 | Litsyn et al. | |
| 2007/0143561 A1 | 6/2007 | Gorobets | |
| 2007/0150694 A1 | 6/2007 | Chang et al. | |
| 2007/0168625 A1 | 7/2007 | Cornwell et al. | |
| 2007/0171714 A1 | 7/2007 | Wu et al. | |
| 2007/0171730 A1 | 7/2007 | Ramamoorthy et al. | |
| 2007/0180346 A1 | 8/2007 | Murin | |
| 2007/0223277 A1 | 9/2007 | Tanaka et al. | |
| 2007/0226582 A1 | 9/2007 | Tang et al. | |
| 2007/0226592 A1 | 9/2007 | Radke | |
| 2007/0228449 A1 | 10/2007 | Takano et al. | |
| 2007/0253249 A1 | 11/2007 | Kang et al. | |
| 2007/0253250 A1 | 11/2007 | Shibata et al. | |
| 2007/0263439 A1 | 11/2007 | Cornwell et al. | |
| 2007/0266291 A1 | 11/2007 | Toda et al. | |
| 2007/0271494 A1 | 11/2007 | Gorobets | |
| 2008/0010581 A1 | 1/2008 | Alrod et al. | |
| 2008/0028014 A1 | 1/2008 | Hilt et al. | |
| 2008/0055989 A1 | 3/2008 | Lee et al. | |
| 2008/0082897 A1 | 4/2008 | Brandman et al. | |
| 2008/0092026 A1 | 4/2008 | Brandman et al. | |
| 2008/0104309 A1 | 5/2008 | Cheon et al. | |
| 2008/0116509 A1 | 5/2008 | Harari et al. | |
| 2008/0126686 A1 | 5/2008 | Sokolov et al. | |
| 2008/0127104 A1 | 5/2008 | Li et al. | |
| 2008/0128790 A1 | 6/2008 | Jung | |
| 2008/0130341 A1 | 6/2008 | Shalvi et al. | |
| 2008/0137413 A1 | 6/2008 | Kong et al. | |
| 2008/0148115 A1 | 6/2008 | Sokolov et al. | |
| 2008/0158958 A1 | 7/2008 | Shalvi et al. | |
| 2008/0159059 A1 | 7/2008 | Moyer | |
| 2008/0162079 A1 | 7/2008 | Astigarraga et al. | |
| 2008/0168216 A1 | 7/2008 | Lee | |
| 2008/0168320 A1 | 7/2008 | Cassuto et al. | |
| 2008/0181001 A1 | 7/2008 | Shalvi | |
| 2008/0198650 A1 | 8/2008 | Shalvi et al. | |
| 2008/0198652 A1 | 8/2008 | Shalvi et al. | |
| 2008/0219050 A1 | 9/2008 | Shalvi et al. | |
| 2008/0225599 A1 | 9/2008 | Chae | |
| 2008/0263262 A1 | 10/2008 | Sokolov et al. | |
| 2008/0282106 A1 | 11/2008 | Shalvi et al. | |
| 2008/0285351 A1 | 11/2008 | Shlick et al. | |
| 2008/0301532 A1 | 12/2008 | Uchikawa et al. | |
| 2009/0024905 A1 | 1/2009 | Shalvi et al. | |
| 2009/0043951 A1 | 2/2009 | Shalvi et al. | |
| 2009/0072303 A9 | 3/2009 | Prall et al. | |
| 2009/0091979 A1 | 4/2009 | Shalvi | |
| 2009/0103358 A1 | 4/2009 | Sommer et al. | |
| 2009/0106485 A1 | 4/2009 | Anholt | |
| 2009/0113275 A1 | 4/2009 | Chen et al. | |
| 2009/0125671 A1 | 5/2009 | Flynn et al. | |
| 2009/0144600 A1 | 6/2009 | Perlmutter et al. | |
| 2009/0150748 A1 | 6/2009 | Egner et al. | |
| 2009/0157964 A1 | 6/2009 | Kasorla et al. | |

| | | |
|---|---|---|
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1* | 1/2012 | Katz et al. ............... 365/185.24 |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.

Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

ThresholdInfo

BlockIndex
1BpcThresholds
2BpcThresholds
3BpcThresholds

SYSTEMS AND METHODS FOR STORING, RETRIEVING, AND ADJUSTING READ THRESHOLDS IN FLASH MEMORY STORAGE SYSTEM

REFERENCE TO RELATED APPLICATIONS

This patent application claims priority from U.S. provisional patent application Ser. No. 61/361,626 filed Jul. 6, 2010, which is incorporated herein by reference in its entirety.

BACKGROUND OF THE INVENTION

Flash memory devices may store information in the form of an electrical charge which may be programmed into cells by injecting electrons between electrically isolated floating-gates of the cells, where the electrons may be trapped by the insulating properties of the floating-gates. In single-level cell (SLC) devices, each cell may either be programmed with charge or may remain un-programmed (erased), thus effectively defining two binary states to store one bit of information per cell. Multi level cell (MLC) devices may store more than one bit per cell by applying electrical charge to the floating gates in one of multiple (n) levels. Thus, an (n)-level flash cell, where $n=2^k$, may store k bits of information, where each combination of k bits is mapped (e.g. via Gray coding) to one of n program levels. When programming a previously programmed cell, the cell may be overwritten and the cell charge may be erased, for example, by reducing the charge to a constant reference charge value.

Flash memory devices may store information bits in logical units, such as pages, which may encompass several thousands of cells (e.g. 4096, 8192 bytes). Each page may store data for a different j-th bit (j=1, 2, k) of each cell in a row of cells. Thus, a physical row of cells may be programmed using k information pages. When the row of cells is read, all k pages may be read. A plurality of (e.g., 32 or 64) physical rows may form a block. A physical row may be the smallest set of cells which may be programmed simultaneously and a block may be the smallest set of cells which may be erased simultaneously, although other memory partitions may also be used.

The amount of electrical charge stored in the floating gate cell may be directly related to the voltage level used to fully conduct current across the cell's transistor gate. Therefore, the amount of charge in a cell may be measured by the minimal gate voltage level used for conduction (e.g., also known as threshold voltage, $V_T$). Since the actual charge level may vary among cells programmed to a certain program level, the specific threshold voltage may also vary among these cells.

Flash memory devices may be read by comparing the threshold voltage of a cell or a group of cells to one (or more) read threshold(s) or decision level(s). The read threshold(s) may divide voltages into a plurality of different voltage ranges, each associated with a different one of n program levels of the multi-level cell. Read operations may determine within which range the cell voltage falls, and therefore, the associated program level and value of the cell. Each page may be read using a subset of the read threshold(s) used to define the value of the bit associated with that page.

During the life span of a flash memory device, the insulating properties of the floating-gates may degrade and the charge levels of cells may shift to other values, which may be referred to as "charge loss." Charge loss or other errors in the charge stored in cells may result from programming errors (e.g., either intentional or not), age, storage temperature, repeated use of program/erase cycles, retention and various other reasons. Charge loss may cause the cell voltage to decrease causing a spontaneous change in their programming levels generating errors in the flash memory device.

SUMMARY OF THE INVENTION

An embodiment of the invention may provide a method, system and computer-readable medium for reading information from a memory unit. A request may be received to read information from a set of memory cells in the memory unit. At least one read threshold in an initial set of read thresholds may be perturbed to generate a perturbed set of read thresholds. The set of memory cells may be read using the perturbed set of read thresholds to provide a read result. The performance of said reading may be evaluated using the perturbed set of read thresholds. The at least one read threshold may be iteratively perturbed for each sequential read operation that the read performance is evaluated to be sub-optimal.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 schematically illustrates a data structure for storing read thresholds according to the index of cell blocks read by the read thresholds, according to an embodiment of the invention;

Figure 1:
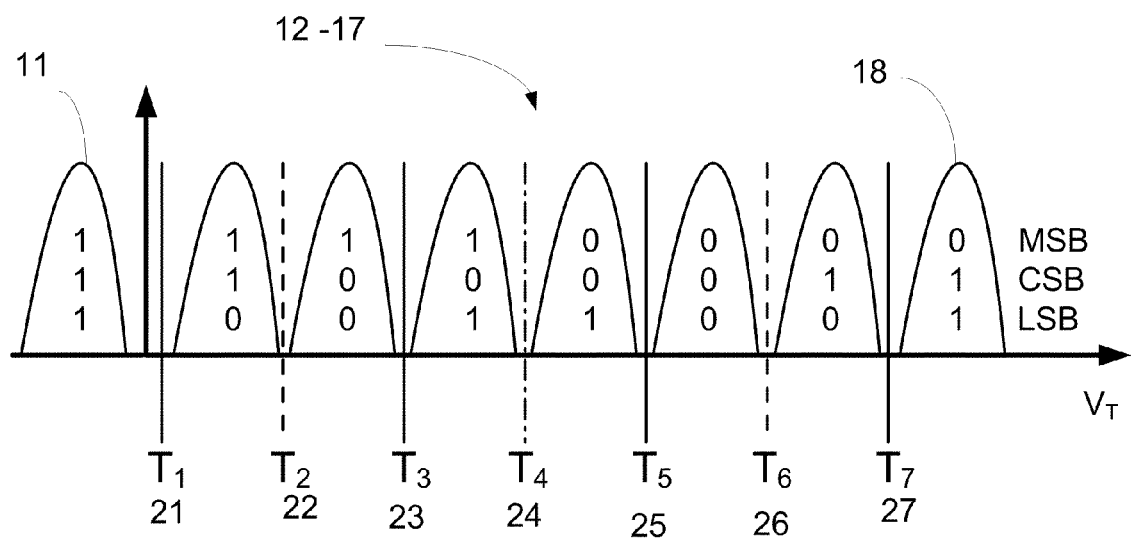
FIG. 1 schematically illustrates a probability distribution function (PDF) for a set of memory cells and corresponding read thresholds prior to charge loss.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Over time, memory cells may degrade causing charge loss, for example, due to a combination of high cycling and substantial retention. As the memory cells lose charge, the threshold voltage induced across the cells may shift, crossing previously computed read thresholds, causing the cells to spontaneously change bit-values to generate errors. Conventional systems may be unable to anticipate such degradation or to correct the errors caused by charge loss and instead, re-compute new read thresholds for each new read operation. However, since memory degradation and charge loss occurs slowly, over a long period of time, the same or similar read thresholds may be repeatedly computed, over and over again, when there is little or no change in cell's threshold voltage, thereby generating redundant read threshold data and wasting processing time and resources.

To avoid such redundant computations, embodiments of the invention may save and re-use read thresholds, previously used in successful read operations, for subsequent read operations reading the same or similar cells (e.g., having the same or similar characteristic values). If there is substantially no charge loss (e.g., low cycling and retention) to the cells since the previous read operation, the read thresholds used during the previous read may be used, e.g., as is or perturbed, to successfully read cells in the subsequent or future read operations. The read thresholds associated with each set of cells (or cell blocks) may be identified by storing relationships between cells and thresholds, for example, in a look-up-table, in metadata attached to the thresholds, or by arranging the thresholds themselves in designated areas associated with the cells. Read thresholds may be arranged and retrieved based on cell characteristics, for example, according to the indices of cell blocks read by the read thresholds (e.g., see FIG. 3-6), the timestamps of the cell blocks—a number of times the memory system has been powered down (turned on/off), for example, since they were previously programmed or over their lifetime (e.g., see FIG. 7-10), the degradation level of the cell blocks (e.g., see FIG. 12-16), and/or a combination of multiple characteristics (e.g., see FIG. 16). Thus, when an instruction is received to read a set of cells, the associated threshold data may be quickly identified in the threshold storage location (e.g., based on block index, timestamp and/or degradation level of the cells) and used, once again, to read a similar set of cells. Re-using the previously generated thresholds may significantly reduce system computations associated with repeatedly generating new versions of the same or similar thresholds.

Read thresholds may be stored when they result in successful reads (e.g., where cell data is correctly decoded). However, even a successful read may still have errors (e.g., up to a predetermined threshold number of errors, which may be the maximum number of errors able to be corrected by error correction code (ECC)). Some embodiments of the invention may determine the performance of a read operation using read thresholds, for example, to determine how close to optimal are the read thresholds, and may improve sub-optimal read thresholds in order to decrease the number of potential errors in future read operations. The performance of read operations may be measured by counting the number of errors using error correction decoding (e.g., using ECC) or by counting and comparing the number of cells associated with a given read threshold before and after error correction decoding. Optimal performance may occur when the number of errors counted or the difference between the numbers of cells counted is less than a predetermined threshold and sub-optimal performance may occur when the number of errors counted or the difference between the numbers of cells counted is greater than (possibly different) a predetermined threshold. If a read has optimal performance (e.g., generates no errors or a relatively small number of errors), the read thresholds may be stored, as is, without adjustment, for future read operations. However, if a read has sub-optimal performance (e.g., generates a relatively large number of errors), instead of storing the read thresholds, as is, and generating the same (or additional) errors in future reads, these read thresholds may be adjusted or perturbed before they are stored in an attempt to decrease the number of errors they generate in future reads.

An initial set of read thresholds may be received to read memory cells. The initial set of read thresholds may or may not be stored and retrieved from a read history database. The accuracy of the cell data read with the initial read thresholds may be evaluated, for example, using error correction data (e.g., ECC) associated with the data. If the read data has optimal accuracy (e.g., less than or equal to a threshold number of errors), the same read thresholds may be used for subsequent read operations of cells with the same or similar characteristics. However, if the read data has sub-optimal accuracy (e.g., greater than the threshold number of errors), the initial read thresholds may be perturbed by a voltage step (e.g., in a predetermined positive or negative voltage direction) for use in the next sequential read operation. In the next read operation, cells may be read using the new perturbed read thresholds and the accuracy of the read data may again be evaluated using the error correction data. If the read data has optimal accuracy, no threshold adjustment may be made. However, if the read data has sub-optimal accuracy, the read accuracy of the previous iteration (using the incremented read thresholds) may be compared to that of the current iteration (using the previous (initial) read thresholds). If the accuracy is increased, but not yet optimal, it may be determined that the threshold adjustment is moving in the right direction, but has not yet reached the optimal voltage. Accordingly, the read thresholds may continue to be perturbed in each sequential read operation using a voltage step in the same direction as the direction of the previous voltage step. However, if the accuracy is decreased (and thus inherently sub-optimal), it may be determined that the threshold adjustment is moving in the wrong direction. In this case, the direction of the voltage step may change in each sequential read operation and the read thresholds may be perturbed using a voltage step in the opposite direction as the direction of the previous voltage step. This process may continue to adjust read thresholds for each sequential read operation or only when a predetermined number of errors are detected, for example, to continuously approach the varying optimal read thresholds for optimal read accuracy of degrading memory cells.

If the magnitude of the voltage step incremented in each read operation is too large, the voltage adjustment may overstep the optimal read thresholds, while if the magnitude of the voltage step is too small, the voltage adjustment may under step the optimal read thresholds. Accordingly, the voltage step magnitude may be dynamically set, for example, based on the number of errors detected in the previous read results. Read thresholds may be adjusted one at a time or in groups of one or more, for example, adjusting all thresholds together defining each bit or page of multi-level cells.

Embodiments of the invention may read information from a memory partition, such as a set of cells (or cell blocks), in a read operation. The read operation may include (a) receiving a request, such as a read instruction, to read information from a memory partition; (b) attempting to retrieve a set of read thresholds from a multi dimensional data structure that are associated with the cell partition, for example, using one or more characteristic value(s) identifying the associated cell partition, such as a cell partition index, a read timestamp, a degradation level and/or a number of program erase cycles of the cells, wherein the value(s) are a key to identify the associated thresholds in the multi dimensional data structure; and, if the attempting to retrieve succeeds, (c) reading the memory partition using the retrieved set of read thresholds.

Figure 15:
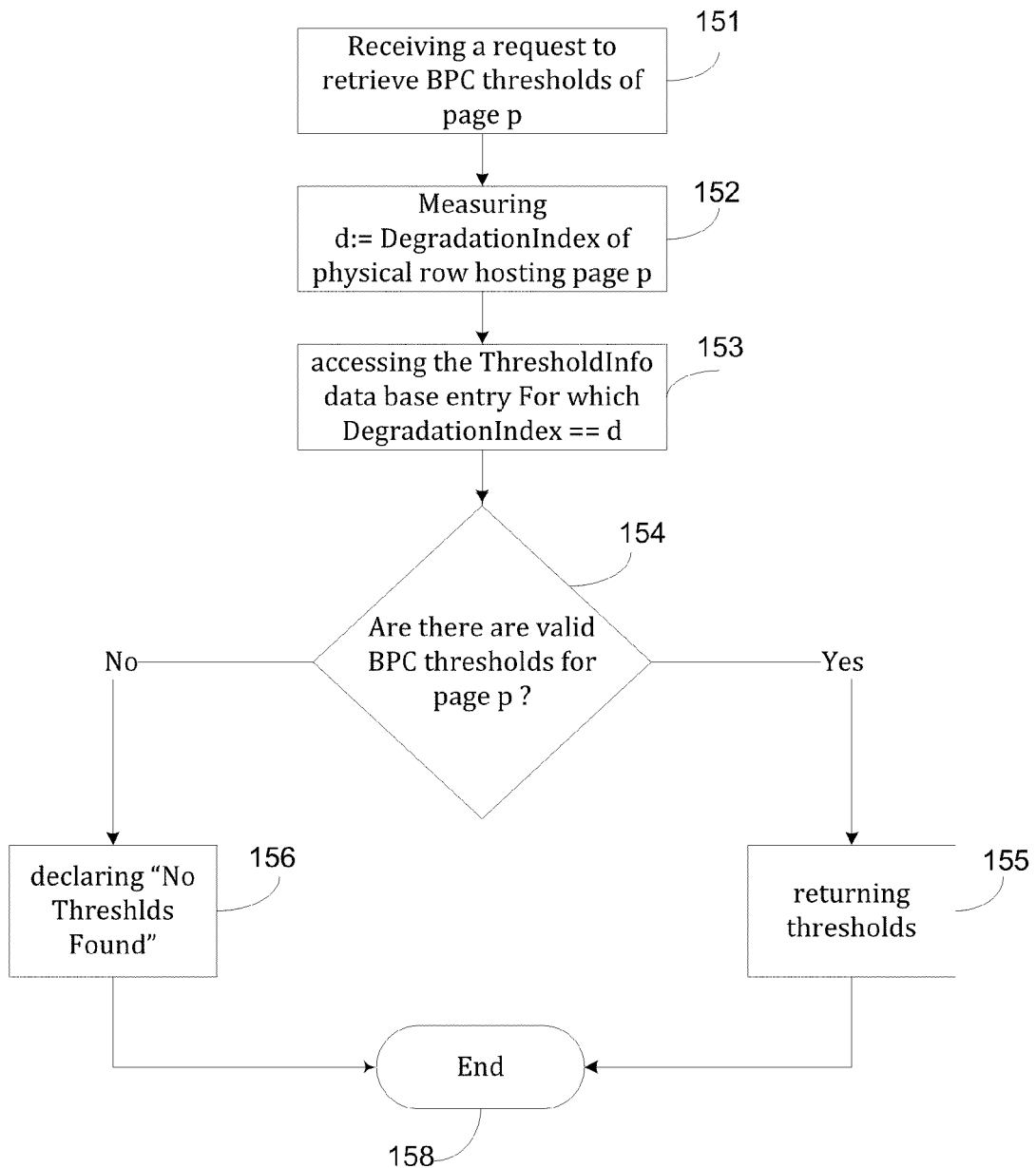
FIG. 15 is a flowchart of a method for retrieving sets of read thresholds arranged according to degradation levels, according to an embodiment of the invention.
Figure 16:
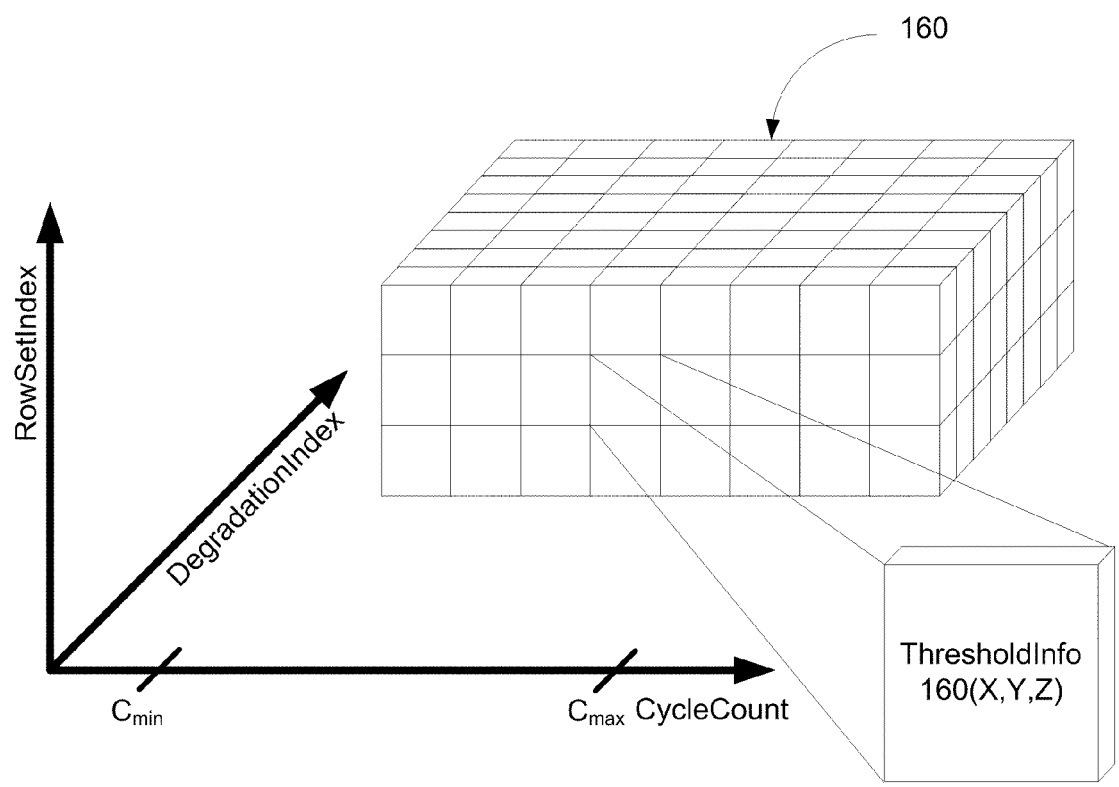
FIG. 16 schematically illustrates a multi dimensional data structure for storing read thresholds for different cell partitions, according to an embodiment of the invention.

The characteristic identifying the cell partition may include, for example, a memory partition identifier (e.g., see FIG. 3-6), a timestamp (e.g., see FIG. 7-10) indicative of a number of times the memory system was powered down or turned on/off (since first use or an initialization time), a degradation level of the memory partition (e.g., see FIG. 12-16) or a combination thereof (e.g., see FIG. 16 for a multi dimensional data structure that may be accessed using a combination of three keys: cycle count, degradation level and row index).

In some cases, a great amount of storage may be used for storing read thresholds generated for every combination of characteristics. Decreasing the number of characteristics or the range of characteristic values may decrease the amount of read threshold generated for each characteristic value combination. In one embodiment, a wear leveling policy may be used to ensure that all the memory cells in a unit have approximately the same or similar cycle count (number of program/erase cycles). Limiting the range of the cycle count between cell blocks may reduce the range of characteristic values and thus, the diversity of read thresholds used for the characteristic values.

Figure 4:
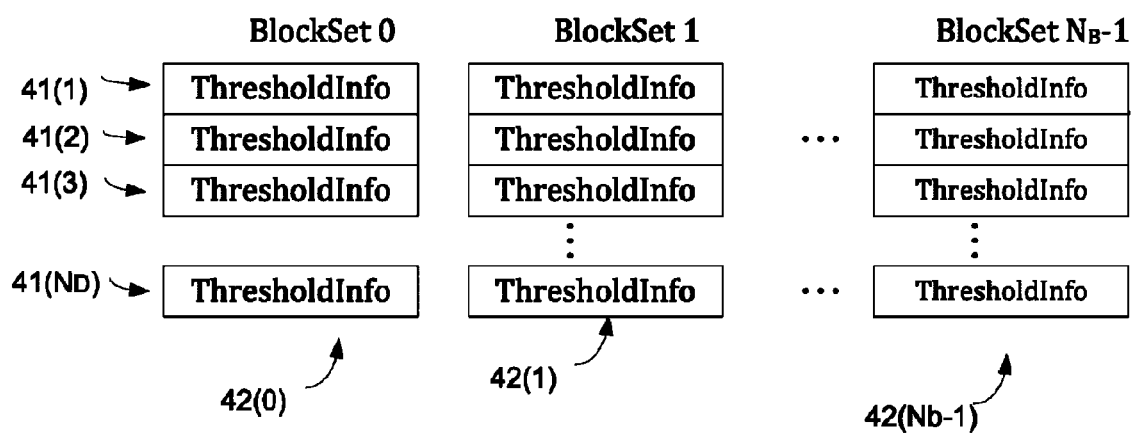
FIG. 4 schematically illustrates a multi dimensional data structure storing read thresholds arranged according to cell block index, according to an embodiment of the invention.
Figure 8:
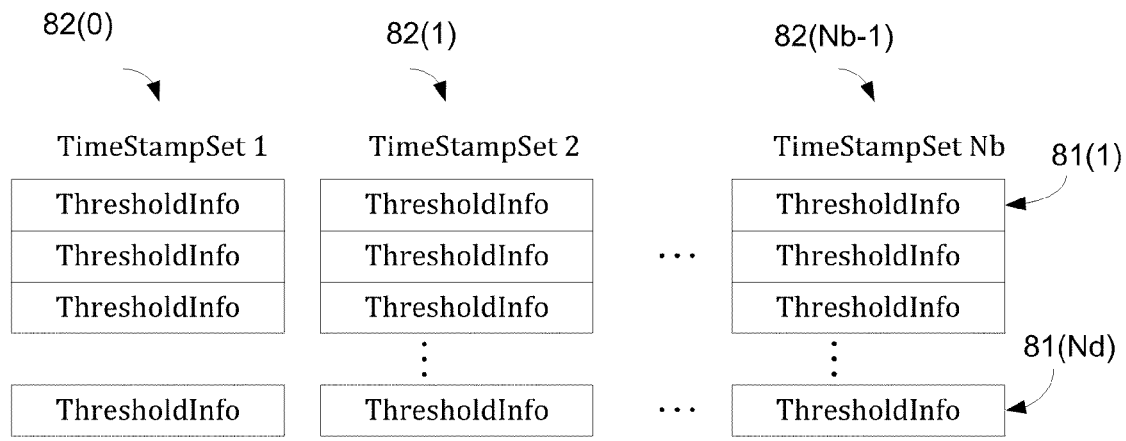
FIG. 8 schematically illustrates a multi dimensional data structure storing read thresholds arranged according to timestamps, according to an embodiment of the invention.

The multi dimensional data structure may be partitioned into rows and columns Each column (or row) may store a set of read thresholds associated with a certain range of characteristic values (e.g., BlockSets of FIG. 4 or TimeStampSets of FIG. 8). For each characteristic value for a read operation, a memory controller may search the multi dimensional data structure to find a characteristic range containing the characteristic value (e.g., operations 62 and 102 of FIGS. 6 and 10). The memory controller may attempt to retrieve the set of read thresholds associated with the cell partition from the multi dimensional data structure partition, e.g., using one or more characteristic values or ranges of the requested cell partition as keys. If the attempt to retrieve read thresholds associated with the cell partition succeeds, the requested cell partition may be read using those thresholds. Otherwise, if the attempt to retrieve read fails (e.g., those thresholds are not stored, such as, if the cell partition has never been previously read), a set of other thresholds (e.g., best-fit or reference thresholds) may be retrieved from the multi dimensional data structure, for example, along with a set of predetermined difference values between the set of read thresholds associated with the memory partition and the reference set of read thresholds.

Reference is made to FIG. 1, which schematically illustrates a probability distribution function 10 of a set of memory cells and corresponding read thresholds prior to charge loss. In the example of FIG. 1, a three bit per cell (3 bpc) memory is used and the information pages associated with the three stored bits may include a most-significant bit (MSB) page, a center significant bit (CSB), and a least-significant bit (LSB). The probability distribution function 10 may include a plurality of (e.g., $2^3$) lobes 11-18, each associated with a different one of the (e.g., $2^3$) program levels of the cells. Each lobe 11-18 may define a voltage range (e.g., or uncertainty) centered about some voltage value for each program level. Any cell voltage that falls within one of lobes 11-18 may be assigned the corresponding program level. The mapping between lobes 11-18 and the program levels for the 3 information bits is marked on each lobe in FIG. 1.

Lobes 11-18 may be divided by read thresholds 21-27, Tn, n=1, 2, 7, defining the boundary voltages of the lobes. Read thresholds 21-27 may be divided into three sets (marked by 3 types of lines in FIG. 1) for retrieving MSB, CSB, or LSB information. The MSB page (e.g., defining the $1^{st}$ bit) may be read using only the single read threshold T4 24. Cells with a threshold voltage less than read threshold T4 24 may be read as "1", while cells with a threshold voltage greater than (or equal to) read threshold T4 24 may be read as "0". The CSB page (e.g., defining the $2^{nd}$ bit) may be read using read thresholds T2 22 and T6 26. Cells with a threshold voltage less than T2 22 or above T6 26 may be read as "1", while the remaining cells may be read as "0". The LSB page (e.g., defining the $3^{rd}$ bit) may be read using read thresholds T1 21, T3 23, T5 25, and T7 27. Cells with a threshold voltage less than T1 21, or between T3 23 and T5 25, or above T7 27 may be read as "1", while the remaining cells may be read as "0".

The position of read thresholds 21-27 may determine the accuracy of data read from the memory cells. If read thresholds are placed incorrectly, many read errors may occur. A read error may occur when a cell, which is programmed to one program level, is erroneously read as belonging to another program level. This may occur if an outer limit (e.g., tail-end) of a first program level's lobe extends beyond the read threshold which is used to distinguish between the first program level and a second (neighboring) program level. Therefore, accurate read thresholds may be placed in between lobes 11-18 of the threshold voltage distributions, such that for each read threshold, there is minimal overlap between the outer limits of the lobes for any two adjacent program levels.

Figure 2:
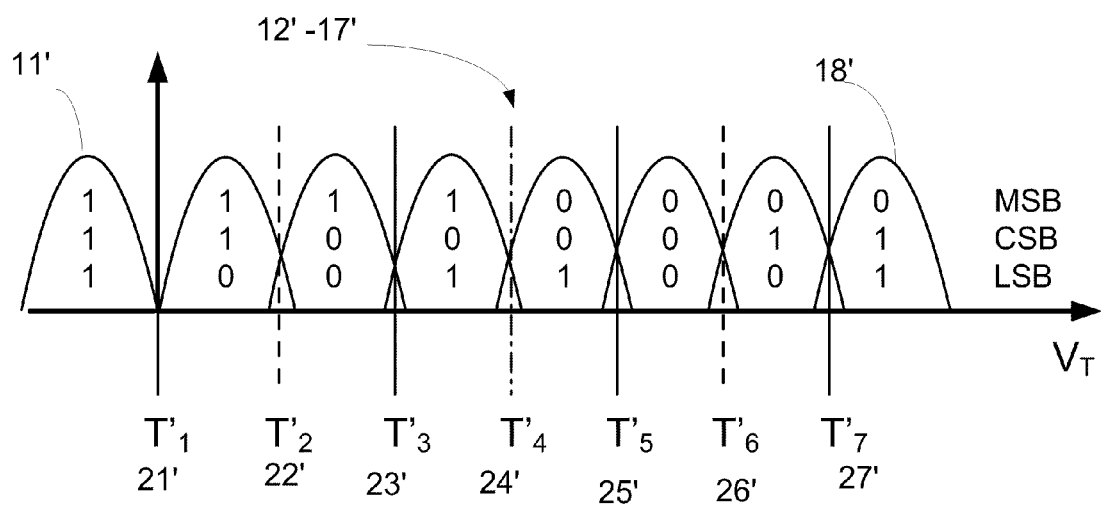
FIG. 2 schematically illustrates a probability distribution function for a set of memory cells and corresponding read thresholds after charge loss.

In some cases, even when read thresholds are optimally placed, read errors may still occur when the memory cells degrade over time, for example, as described in reference to FIG. 2.

Reference is made to FIG. 2, which schematically illustrates a probability distribution function 20 of a set of memory cells and corresponding read thresholds after charge loss. In the example of FIG. 2, a three bit per cell (3 bpc) memory is used, although any k bit per cell memory may be used.

Probability distribution function 20 includes partially overlapping lobes 11'-18' read from a device, for example, having charge loss due to heavy cycling and retention. Lobes 11'-18' may be divided by read thresholds 21'-27', T'n, n=1, 2, 7, defining the boundary voltages of lobes 11'-18'. Due to the charge loss of the cells, even the most optimal placement of read thresholds 21'-27' may still cause the outer voltage limits of lobes 11'-18' to extend beyond read thresholds 21'-27' causing read errors. Error correcting codes (e.g., BCH or LDPC) may be used during programming to correct such read errors.

Optimal read thresholds may change over time, for example, from read thresholds 21-27 positioned to read cells prior to charge loss in FIG. 1 to read thresholds 21'-27' positioned to read cells after charge loss in FIG. 2. As the memory device undergoes more and more program/erase cycles, it becomes more and more susceptible to charge loss due to retention, and optimal read thresholds begin decreasing in voltage over time. When a request is received to read a degraded memory device, read thresholds may be positioned to compensate for the charge loss associated with the aging state of the memory as well as the retention period, in order to retrieve the data with minimal or no errors. Once the read operation is complete, the read thresholds may be stored for future use for reading cells with similar characteristics. In such a case, these thresholds may be retrieved and used directly, instead of re-computing the read threshold, which typically causes a processing delay. However, before storing the read thresholds, it may be constructive to analyze the quality of the read thresholds, i.e. to assess how close to optimal they are. These thresholds may be modified (or adjusted) before they are stored. Examples of such schemes for positioning read thresholds, performing adjustment of read thresholds, and storing/retrieving of read thresholds are described in U.S. patent application Ser. No. 12/596,438 entitled "System and Methods Employing Mock Thresholds to Generate Actual Reading Thresholds in Flash Memory Devices" and U.S. patent application Ser. No. 12/596,450, entitled "Apparatus and Methods for Generating Row-Specific Reading Thresholds in Flash Memory", both of which are assigned to the common assignee of the present Application and are incorporated herein by reference in their entirety.

According to various embodiments of the invention, sets of read thresholds may be stored in a multi dimensional data structure and may be retrieved from the multi dimensional data structure. A retrieved set of read thresholds may be used for reading information from a memory partition.

A memory partition may include multiple memory cells and forms a portion of a memory module. In some examples, the memory partition may be an erase block or a page, although other memory partitions may be used. Thus, if a certain example refers to one partition, such as, a page or to an erase block, it may be applied to other memory partitions.

According to various embodiments of the invention, read thresholds may be adjusted, for example, by incrementally inducing small voltage changes or perturbations to the read threshold voltages in each sequential read operation. The adjusted thresholds may be evaluated, for example, by detecting errors in the read results thereof, to determine the adjustment accuracy.

Read thresholds may be accessed based on one or more values of one or more characteristics of a memory partition.

Figure 24:
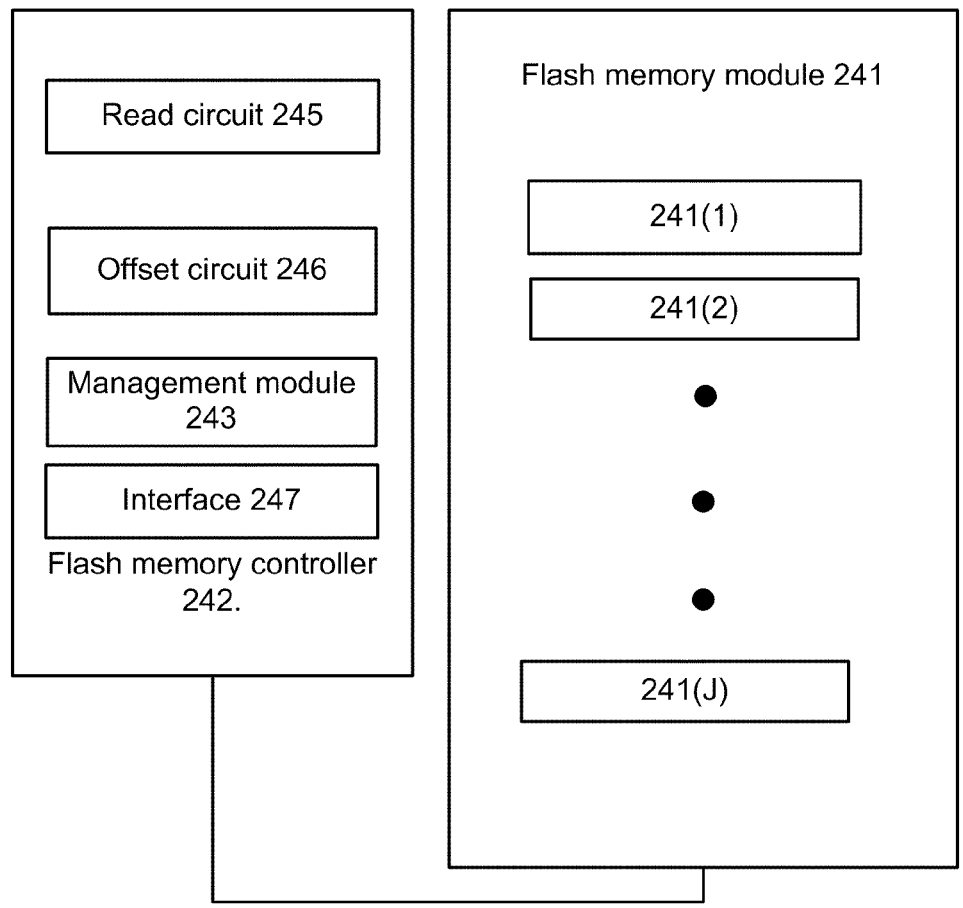
FIGS. 24 and 25 schematically illustrate systems, according to embodiments of the invention.
Figure 25:
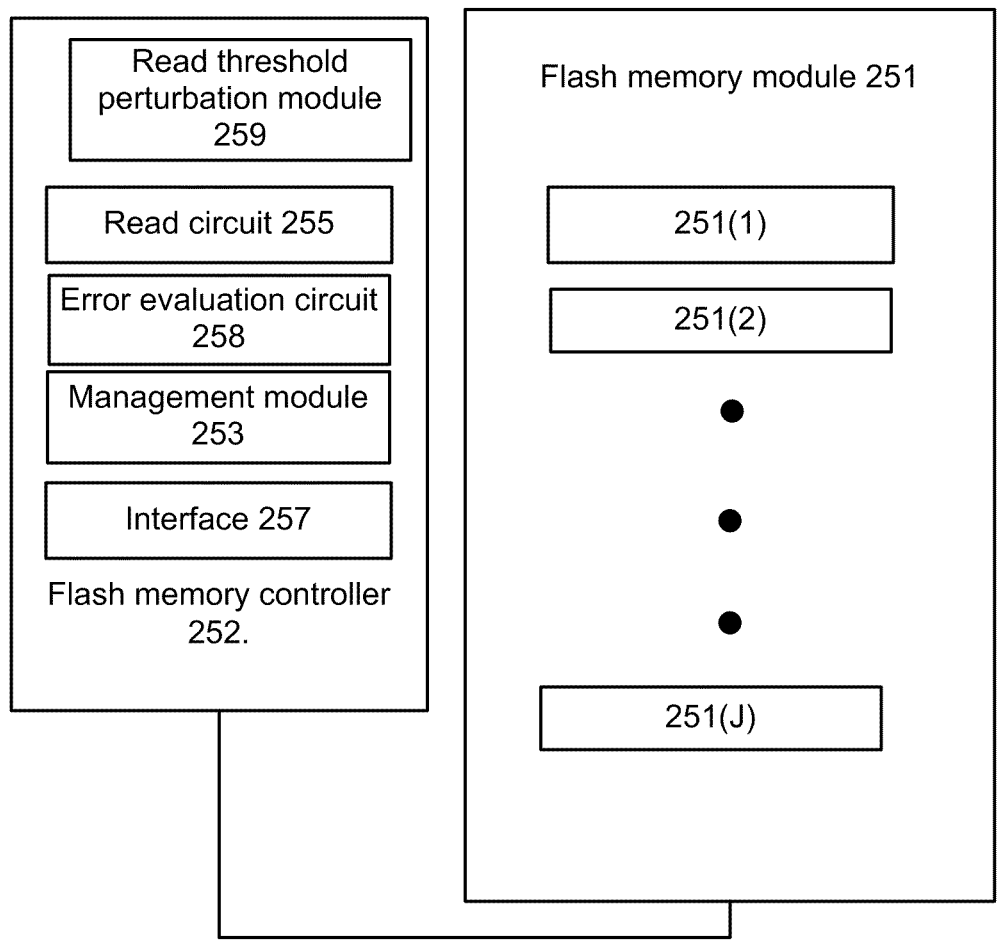

A system may include a memory module and a memory controller. The memory module may include memory cells and analog circuitry which implement the read and write operations, and an interface which may buffer data and issue commands. The memory controller may interface on one side with a host and on the other with the memory module. During a write operation, the memory controller may perform error correction coding (ECC) before programming information to the memory module. During a read operation, the memory controller may set proper read thresholds, activate the read operation of the memory module and perform error correction decoding. Example systems are shown in FIGS. 24 and 25.

Systems and Methods for Management of Read Thresholds Based on Block Indices

A memory controller may access a memory device to retrieve read thresholds from a data structure prior to a read operation. The memory controller may update the memory device upon completion of the read operation, for example, to store the same read thresholds (if usage of these read thresholds for reading resulted in successful decoding) or new read thresholds (if usage of these read thresholds resulted in decoding failure).

The data structure may store a set of read thresholds for a certain set of cells or memory partition. The set of read thresholds may be the most recently updated set of read thresholds that is most recently used to read the set of cells. For example, the data structure may store an initial set of read thresholds T1-T7 21-27 for a certain memory partition at an initial time and may update the thresholds to a subsequent set of read thresholds T1'-T7' 21'-27' for a partition with the same characteristic value(s) at a subsequent time. Threshold updates may be made independently for each individual threshold, for one or more thresholds for each individual page, or for all thresholds together for each set of cell(s) or partition.

Reference is made to FIG. 3, which schematically illustrates a data structure 30 for storing read thresholds according to cell block index, according to an embodiment of the invention. Data structure 30 may be an atomic or basic data structure forming the smallest storage component in a memory device. Data structure 30 (ThresholdInfo) may include, for example the following information fields:

i. BlockIndex—The physical index of a cell partition in the memory module.

ii. 1BpcThresholds—A single read threshold used for reading the MSB page when 1 bit is written to each cell.

iii. 2BpcThresholds—3 read thresholds used for reading the MSB/CSB pages when 2 bits are written to each cell.

iv. 3BpcThresholds—7 read thresholds used for reading the MSB/CSB/LSB pages when 3 bits are written to each cell.

Reference is made to FIG. 4, which schematically illustrates a multi dimensional data structure 40 storing read thresholds arranged according to cell block index, according to an embodiment of the invention.

Data structure 40 may store an array of (Nb)×(Nd) basic data structures (e.g., basic data structures 30 of FIG. 3). Data structure 40 may include rows 41(1)-41(Nd) and columns 42(0)-42(Nb−1). Each column may be associated with a different set of memory partitions, such as, a different set of blocks. All the blocks of a memory unit may be divided into (Nb) block sets, where each block set has approximately equal size (or number of basic data structures). In one example, block index (i) may be mapped to BlockSet j if j=mod(i, Nb). Each BlockSet (each column of data structure 40) may include (Nd) entries of ThresholdInfo (e.g., basic data structures 30).

Nd (and optionally Nb) may be chosen according to system memory constraints, e.g., a size of memory space allocated for storing the multi dimensional data structure and a desired time of retrieving a set of read thresholds. The selected Nd and Nb may balance search complexities and miss rates, where a miss may be defined as an event for which the thresholds of a desired block are not found. Miss rate computations may depend on the conditions for testing the miss rate, such as, the pattern of the cell block to be read. For example, in some applications, read locations may be uniformly distributed throughout an entire memory, while in other applications, read requests may be addressed to a certain subset of blocks for a certain period of time and then shifted to another subset of blocks for another period of time. In the first application, a large Nb and a small Nd may be preferred (e.g., assuming Nb*Nd is constant) since this selection does not affect the miss rate and has a relatively small search complexity. On the other hand, in the second application, a larger Nd may be preferred in case several blocks from the same block set are chosen to be read for a substantially long time duration.

Figure 5:
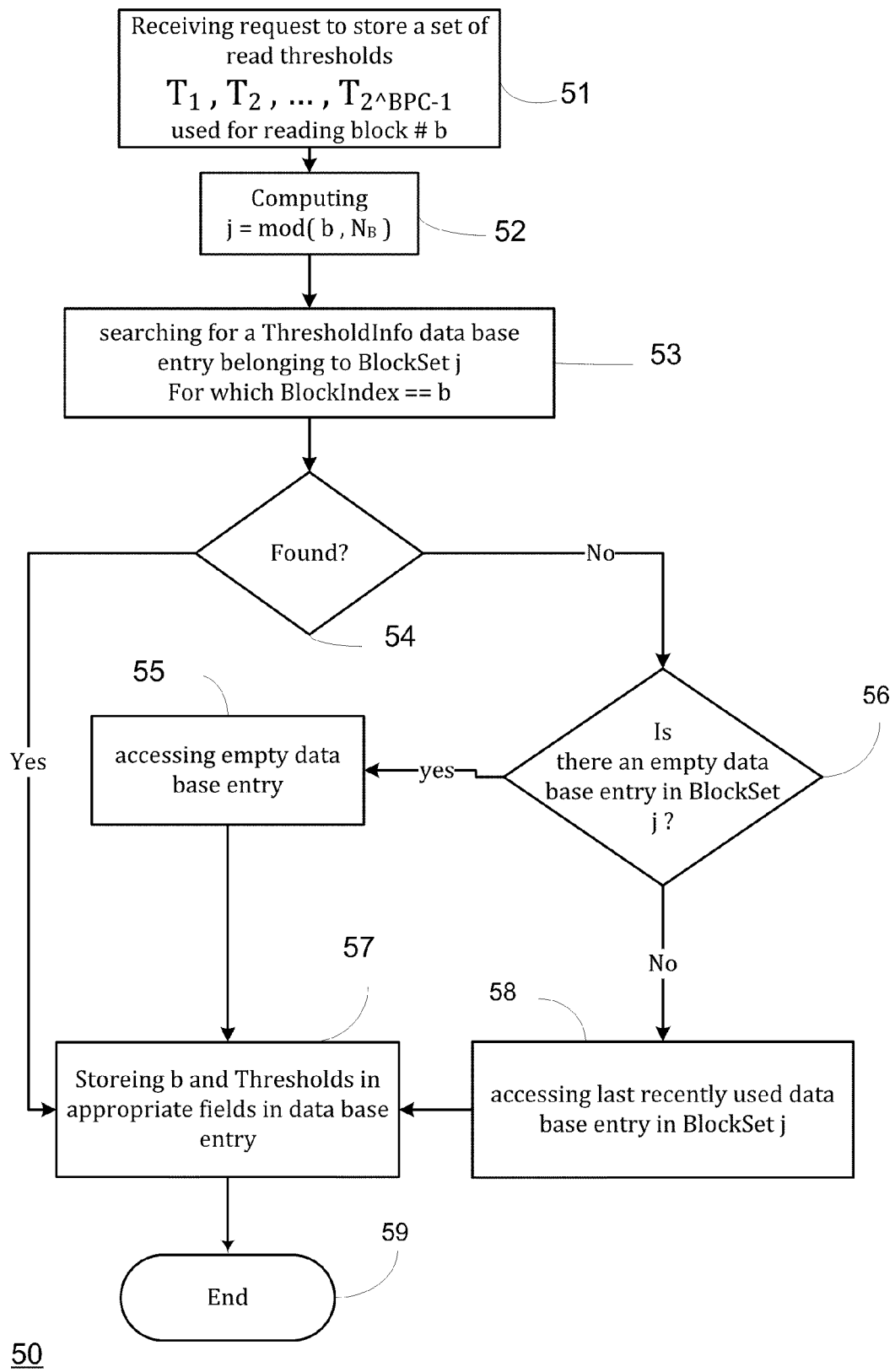
FIG. 5 is a flowchart of a method for storing sets of read thresholds arranged according to cell block index, according to an embodiment of the invention.

Reference is made to FIG. 5, which is a flowchart of a method 50 for storing sets of read thresholds arranged according to cell block index, according to an embodiment of the invention.

In operation 51, a request may be received to store a set of read thresholds used for reading a block with block index ("#b"). To read a block in a memory device with a number of bits per cell (BPC), the set of read thresholds may include $2^{BPC}-1$ read thresholds T1, T2, ..., T(2^BPC−1). To read an Mth page for the Mth bit of the cells, the set of read thresholds may include $2^{M-1}$ read thresholds.

In operation 52, j=modulo (b, Nb) may be computed to map cell block b to a corresponding Blockset j.

In operation 53, for each value computed for j=modulo (b, Nb), the BlockSet j may be searched for a basic data structure (ThresholdInfo) associated with a block of block index ("#b").

In operation 54, it may be determined if the basic data structure (searched for in operation 53) is found. If so, a process or processor may proceed to operation 57; otherwise a process or processor may proceed to operation 56.

In operation 57, the basic data structure may be updated with the set of read thresholds received during operation 51.

Operation 57 may be followed by an "END" operation 59.

However, if the basic data structure is not found, operation 56 may determine if there is an empty entry in BlockSet j. If an empty entry is found, the empty entry may be accessed in operation 55 and a process or processor may proceed to operation 57 to update the empty entry with the set of read thresholds received during operation 51.

If there is not an empty entry in BlockSet j, the last recently used non-empty entry may be re-written in operation 58 with the set of read thresholds received during operation 51.

Figure 6:
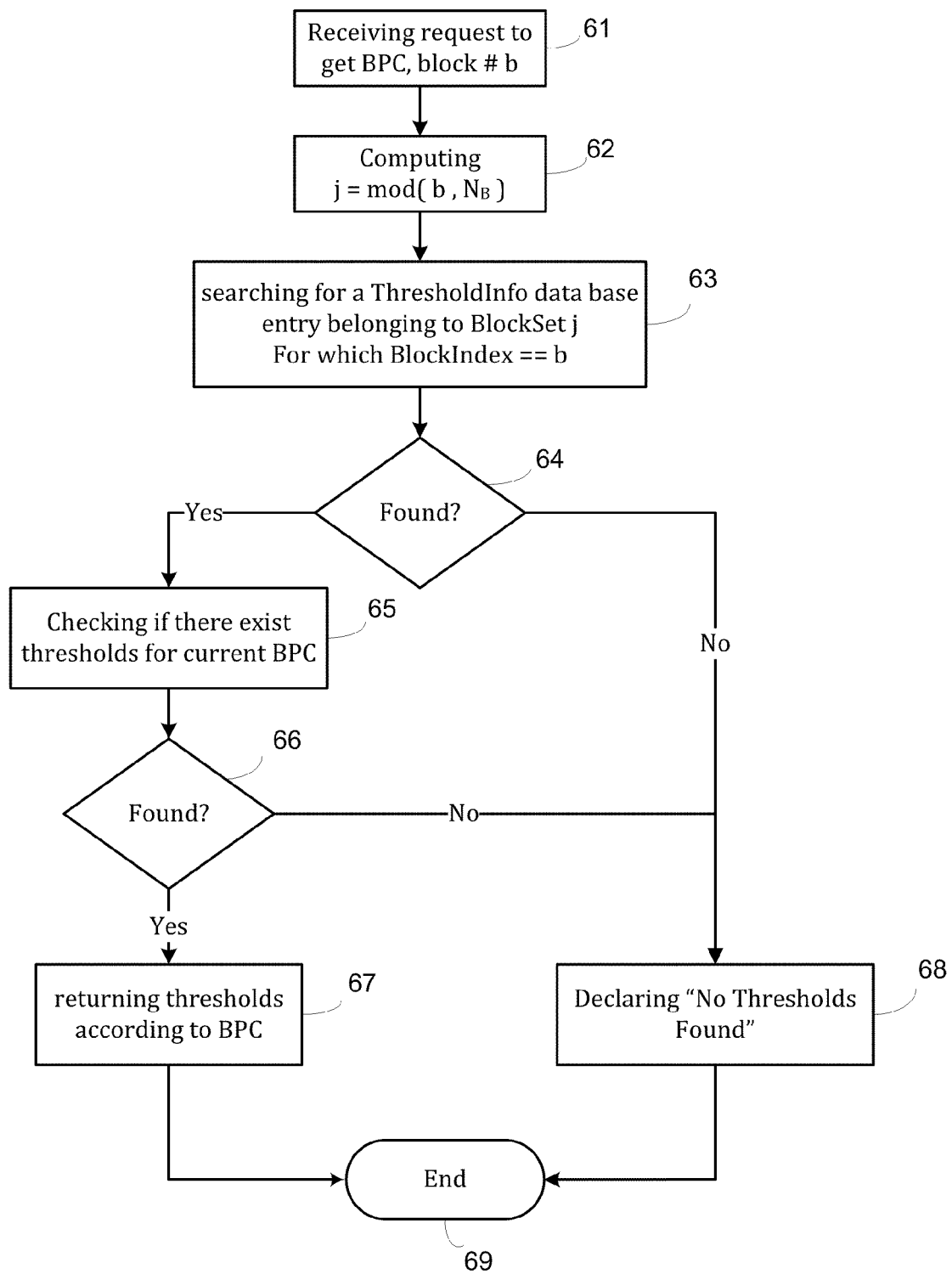
FIG. 6 is a flowchart of a method for retrieving sets of read thresholds arranged according to cell block index, according to an embodiment of the invention.

Reference is made to FIG. 6, which is a flowchart of a method 60 for retrieving sets of read thresholds arranged according to cell block index, according to an embodiment of the invention.

In operation 61, a request may be received to read a block with block index ("#b"). To read a block b in a memory device with a number of bits per cell (BPC), a set of read thresholds may be retrieved, for example, including read thresholds T1, T2, ..., T(2^BPC−1). To read an Mth page of block b defining the Mth bit of the cells, the set of read thresholds may include $2^{M-1}$ read thresholds.

In operation 62, j=modulo (b, Nb) may be computed.

In operation 63, for each value computed for j=modulo (b, Nb), the BlockSet j may be searched for a basic data structure (ThresholdInfo) associated with a block of block index ("#b").

In operation 64, it may be determined if the basic data structure (searched for in operation 63) is found. If so, a process or processor may proceed to operation 65; otherwise a process or processor may proceed to operation 68.

In operation 68, a search failure may be declared, e.g., "No Thresholds Found".

If the basic data structure is found, in operation 65, the basic data structure may be searched for the set of read thresholds requested in operation 61.

In operation 66, it may be determined if the basic data structure (searched in operation 65) has the requested set of read thresholds. If so, a process or processor may proceed to operation 67; otherwise a process or processor may proceed to operation 68.

In operation 67, the found requested set of read thresholds may be returned to complete the request received in operation 61.

Operations 67 and 68 may be followed by an "END" operation 69.

Systems and Methods for Management of Read Thresholds Based on Time Stamp

Timestamps may be used to estimate the time which has passed since a block was last programmed Whenever a cell block is programmed, the instantaneous value of time, the timestamp, may be recorded, for example, in a data structure managed by the controller. Each programmed block may have one and only one timestamp. When a request is received to read a block at a current time, the timestamp may be subtracted from a current time indication to estimate the duration of time from when the block was last programmed to when it is currently read. The more accurate the time estimation, the more likely the read thresholds associated with this estimation will be able to accurately read the cells.

Figure 7:
FIG. 7 schematically illustrates a data structure for storing read thresholds arranged according to timestamps, according to an embodiment of the invention.

Reference is made to FIG. 7, which schematically illustrates a data structure 70 for storing read thresholds arranged according to timestamps, according to an embodiment of the invention. Data structure 70 may be an atomic or basic data structure forming the smallest storage component in a memory device. Data structure 70 (ThresholdInfo) may include, for example the following information fields:

i. TimeStamp—A number of times a memory partition is powered down (turned on/off) since the previous programming of the memory partition (or another initialization time). Each memory partition (such as a block) may be associated with a timestamp value associated with a previous programming attempt. This value may be compared to a current timestamp value of a current number of power downs of the memory module to estimate the duration of time from when the block was previously programmed to when it is currently read.

ii. BlockIndex—The physical index of a cell partition in the memory module.

iii. 1BpcThresholds—A single read threshold used for reading the MSB page when 1 bit is written to each cell.

iv. 2BpcThresholds—3 read thresholds used for reading the MSB/CSB pages when 2 bits are written to each cell.

v. 3BpcThresholds—7 read thresholds used for reading the MSB/CSB/LSB pages when 3 bits are written to each cell.

Reference is made to FIG. 8, which schematically illustrates a multi dimensional data structure 80 storing read thresholds arranged according to timestamps, according to an embodiment of the invention.

Data structure 80 may store an array of (Nb)×(Nd) basic data structures (e.g., basic data structures 70 of FIG. 7). Data structure 80 may include rows 81(1)-81(Nd) and columns 82(0)-82(Nb−1). Each column may be associated with a different set of timestamp values. The timestamp range may be divided into (Nb) timestamp sets. For example, timestamp t is mapped to Timestampset j if j=mod(t, Nb).

Figure 9:
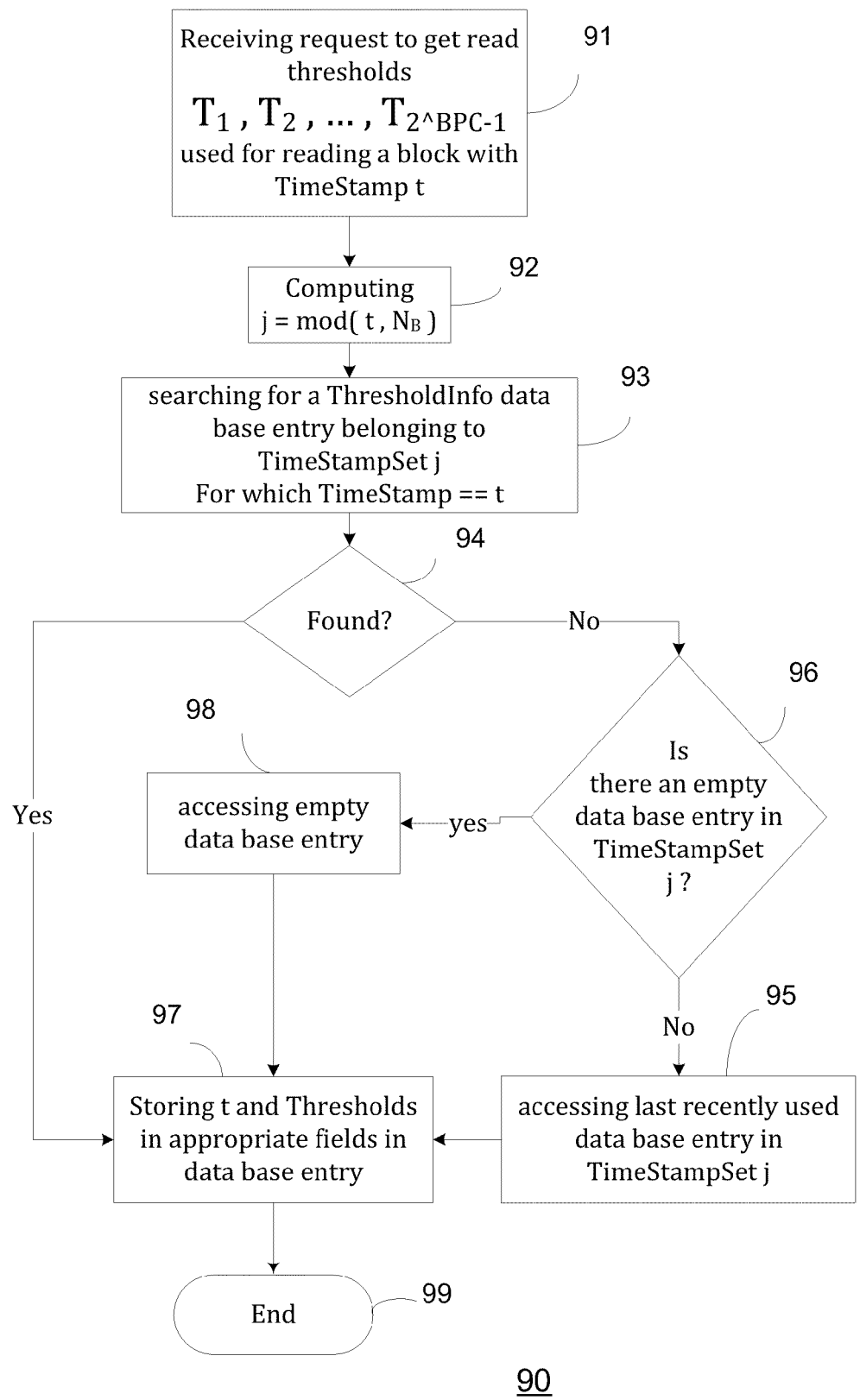
FIG. 9 is a flowchart of a method for storing sets of read thresholds arranged according to timestamps, according to an embodiment of the invention.

Reference is made to FIG. 9, which is a flowchart of a method 90 for storing sets of read thresholds arranged according to timestamps, according to an embodiment of the invention.

In operation 91, a request may be received to get a set of read thresholds used for reading a block with a timestamp ("t"). To read a block in a memory device with a number of bits per cell (BPC), the set of read thresholds may include read thresholds $T1, T2, \ldots, T(2^{\wedge}BPC-1)$. To read an Mth page for the Mth bit of the cells, the set of read thresholds may include $2^{M-1}$ read thresholds.

In operation 92, j=modulo (t, Nb) may be computed.

In operation 93, for each value computed for j=modulo (t, Nb), the Timestampset j may be searched for a basic data structure (ThresholdInfo) associated with a block with a timestamp t.

In operation 94, it may be determined if the basic data structure (searched for in operation 93) is found. If so, a process or processor may proceed to operation 97; otherwise a process or processor may proceed to operation 96.

In operation 97, the basic data structure may be updated with the timestamp value t and the associated set of read thresholds requested in operation 91.

Operation 97 may be followed by an "END" operation 99.

However, if the basic data structure is not found, operation 96 may determine if there is an empty entry in Timestampset j. If an empty entry is found, the empty entry may be accessed in operation 98 and a process or processor may proceed to operation 97 to update the empty entry with the timestamp t and associated set of read thresholds.

If there is not an empty entry in Timestampset j, the last recently used non-empty entry may be accessed in operation 95 and re-written in operation 97 with the timestamp value t and the associated set of read thresholds requested in operation 91.

Figure 10:
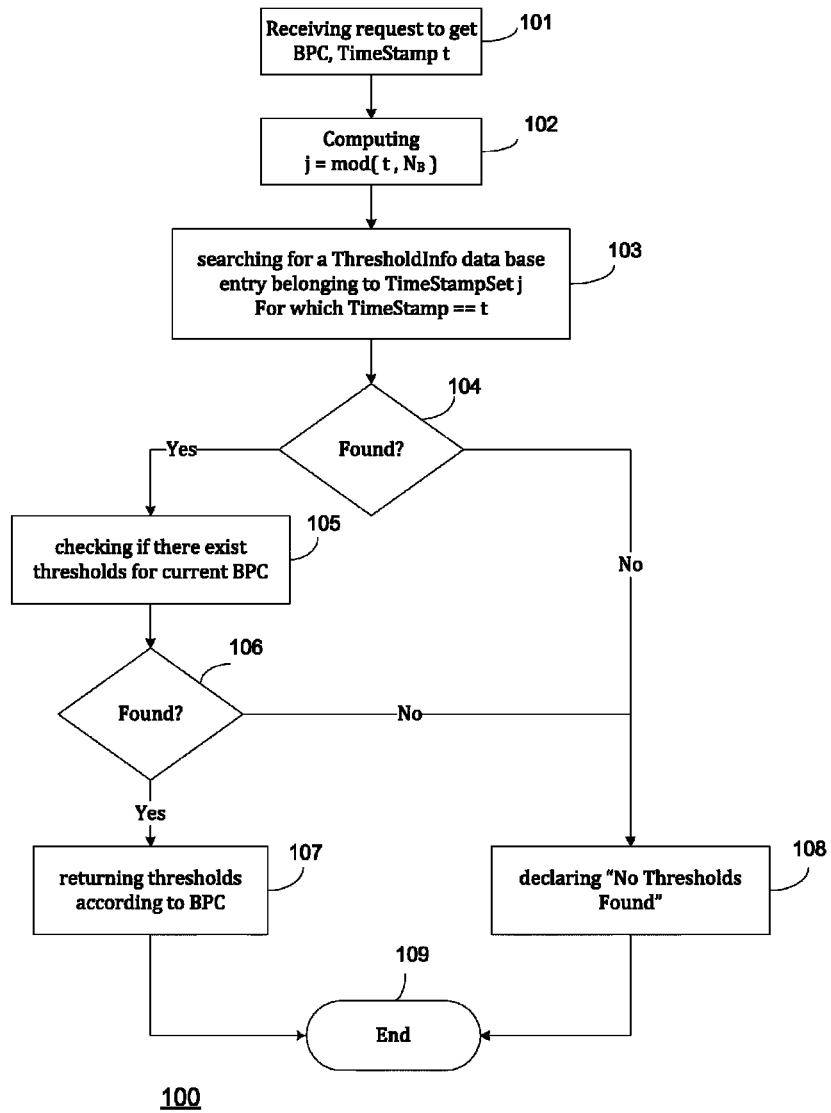
FIG. 10 is a flowchart of a method for retrieving sets of read thresholds arranged according to timestamps, according to an embodiment of the invention.

Reference is made to FIG. 10, which is a flowchart of a method 100 for retrieving sets of read thresholds arranged according to timestamps, according to an embodiment of the invention.

In operation 101, a request may be received to read a block with a timestamp ("t"). To read a block with a timestamp t in a memory device with a number of bits per cell (BPC), a set of read thresholds may be retrieved, for example, including read thresholds $T1, T2, \ldots, T(2^{\wedge}BPC-1)$. To read an Mth page for the Mth bit of the cells, the set of read thresholds may include $2^{M-1}$ read thresholds.

In operation 102, j=modulo (t, Nb) may be computed.

In operation 103, for each value computed for j=modulo (t, Nb), the Timestampset j may be searched for a basic data structure (ThresholdInfo) associated with a block with a timestamp t.

In operation 104, it may be determined if the basic data structure (searched for in operation 103) is found. If so, a process or processor may proceed to operation 105; otherwise a process or processor may proceed to operation 108.

In operation 108, a search failure may be declared, e.g., "No Thresholds Found".

If the basic data structure is found, in operation 105, the basic data structure may be searched for the set of read thresholds requested in operation 101.

In operation 106, it may be determined if the basic data structure (searched in operation 105) has the requested set of read thresholds. If so, a process or processor may proceed to operation 107; otherwise a process or processor may proceed to operation 108.

In operation 107, the found requested set of read thresholds may be returned to complete the request received in operation 101.

Operations 107 and 108 may be followed by an "END" operation 109.

Systems and Methods for Management of Read Thresholds Based on Degradation

According to some embodiments of the invention, a multi dimensional data structure may include different entries for different degradation levels. The degradation levels may be divided into sets of degradation levels and a different set of entries may be allocated to each set of degradation levels. Accordingly, embodiments of the invention described in reference to FIGS. 5, 6, 9 and 10 may be similarly applied mutatis mutandis to degradation characteristics. Each degradation level may be used as a key to access read thresholds in a data structure that are associated with cells or cell blocks having that degradation level. A set of read thresholds may be used to read lightly cycled blocks with heavy retention as well as heavily cycled blocks with less severe retention. In this way, a relatively small diversity or number of different sets of read thresholds may be used to read all the blocks in the memory device.

This threshold management scheme may include measuring a degradation level of the memory partition or receiving the degradation level. This degradation level may be defined, for example, by a DegradationIndex field. The degradation level may be evaluated by performing one or more read operation of the memory partition to provide one or more read results and processing the read results.

The program level distribution (PDF) may define the number of memory cells expected to store different values of voltage. For example, if initially the number of memory cells that store voltage levels that form a lobe are substantially the same for each lobe, then the initial number of memory cells that are expected to store a voltage level that form each individual lobe (e.g., the highest voltage or right-most lobe) may be equal to the average of the number of memory cells for all the lobes. The degradation of a memory partition may result in deviations from the initial program level distribution and may be evaluated by measuring such deviations. The deviations may be measured by counting the number of memory cells that store voltage values within lobes for a current cell value state and comparing this number to a number approximated for the previous or initial initially read state of the memory partition, for example, as described in reference to FIG. 11A.

Figure 11A:
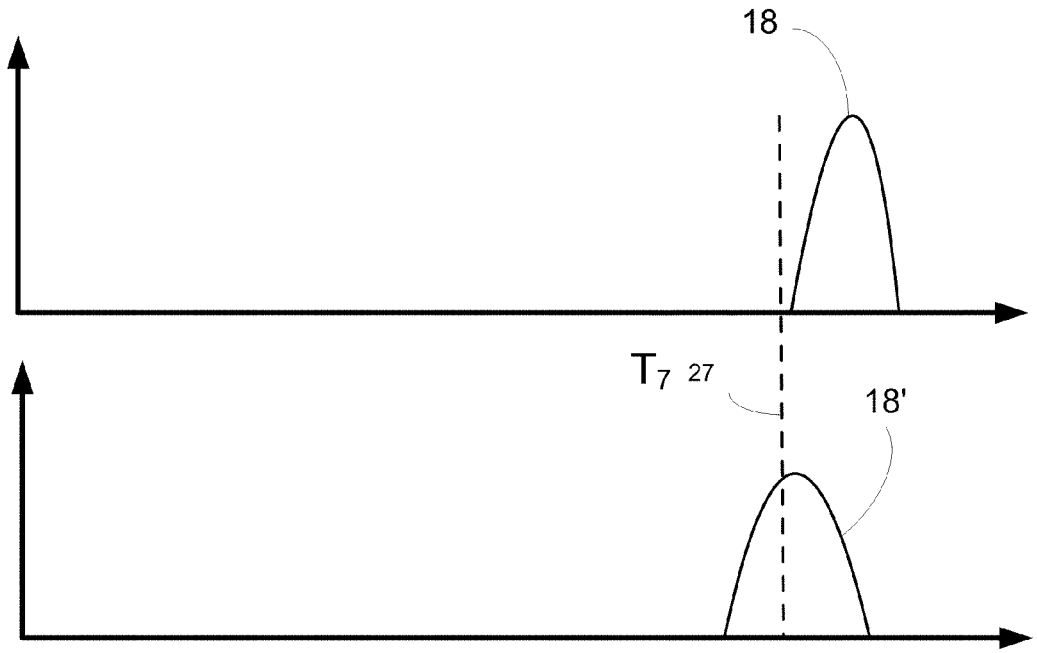
FIG. 11A schematically illustrates a probability distribution function for memory cells before and after charge loss used to evaluate the degradation level of the cells, according to an embodiment of the invention.

Reference is made to FIG. 11A, which schematically illustrates a probability distribution function for memory cells before and after charge loss used to evaluate the degradation level of the cells, according to an embodiment of the invention.

Lobe 18 may represent the voltage distribution of a set of (N) cells exceeding a read threshold 27 immediately after programming (e.g., during the read operation for the cells after they were programmed). At a later time for the same cells, for example, after undergoing retention, the number of memory cells that still store a voltage that is above read threshold 27 may decrease from (N) to (N0) (e.g., the voltage profile of the N0 cells represented by the portion of lobe 18' with a voltage greater than read threshold 27, i.e. positioned to the right of threshold 27). This reduction in cell voltage that spontaneously degrades from lobe 18 to lobe 18' across threshold 27 may indicate the degradation level of the cells. The degradation level of the cells may be calculated, for example, as a difference, ratio, average or other measure of change of the voltage or number of cells that cross threshold 27 since the programming operation. It is noted that the degradation of cells may be defined, not only by measuring the number of memory cells associated with a single lobe, but also with multiple lobes.

Figure 11B:
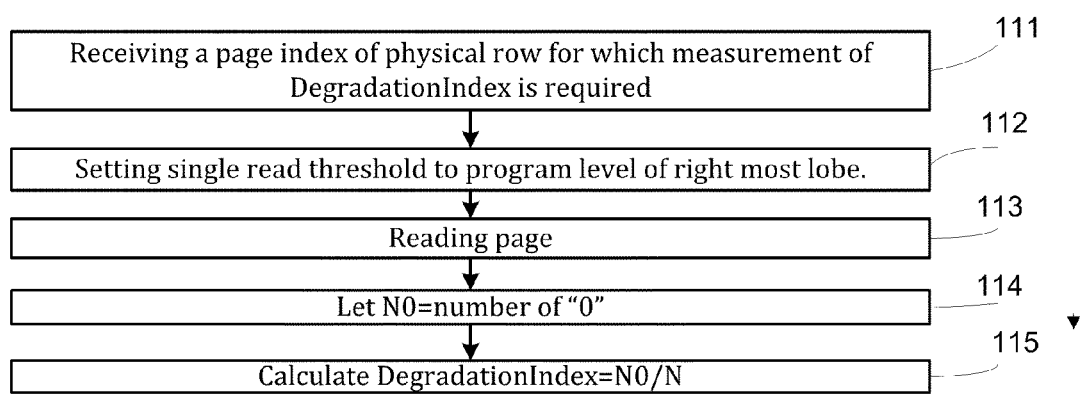
FIG. 11B is a flowchart of a method for evaluating a degradation level, according to an embodiment of the invention.

Reference is made to FIG. 11B, which is a flowchart of a method 110 for evaluating a degradation level of a memory partition, according to an embodiment of the invention.

In operation 111, a memory partition identifier may be received for which the degradation level (e.g., Degradation-Index) is to be measured. The partition may be, for example, a page index of a physical row, although another partition of another size may be used.

In operation 112, a read threshold may be set for reading a lobe. In one example, the voltage of the read threshold may be set to the exact program voltage used to program the highest voltage lobe.

In operation 113, the memory partition may be read using the read threshold set in operation 112 to generate a read result.

In operation 114, the number (N0) of cells in the read result that store "0" may be counted, for example, indicating the number of memory cells that store voltage levels higher than the read threshold set in operation 112.

In operation 115, the degradation level of the memory partition may be determined based on the number (N0) of "0" counted in operation 114 and the number (N) of cells that are programmed to the highest lobe. The degradation level may be, for example, a ratio between N0 and N, a difference between N0 and N, an average between N0, N (and/or any numbers from intermediate reads, e.g., retrieved from a stored history log), or any other measure of the change between N0 and N, or any function of N0 and/or N. Other measures for DegradationIndex may be used.

Although FIGS. 11A and 11B are described in reference to evaluating a lobe with the highest voltage range (e.g., lobes 18 and 18' of FIGS. 1 and 2), any other one or more different lobes may be used. In such cases, appropriate read thresholds may be used with a post read manipulation to extract the number of cells on which to base the computation of the degradation index.

Figure 12:
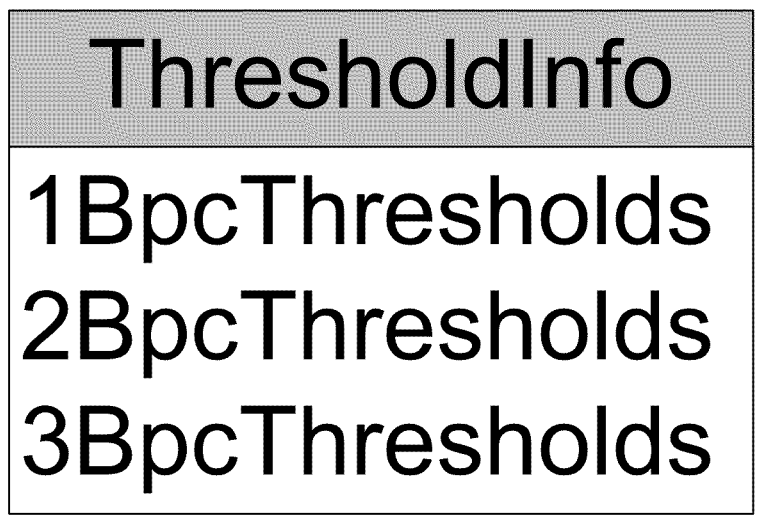
FIG. 12 schematically illustrates a data structure for storing read thresholds arranged according to degradation levels, according to an embodiment of the invention.

Reference is made to FIG. 12, which schematically illustrates a data structure 120 for storing read thresholds arranged according to degradation levels, according to an embodiment of the invention. Data structure 120 may be an atomic or basic data structure forming the smallest storage component in a memory device. Data structure 120 (ThresholdInfo) may include, for example the following information fields:

i. DegradationIndex.

ii. 1BpcThresholds—A single read threshold used for reading the MSB page when 1 bit is written to each cell.

iii. 2BpcThresholds—3 read thresholds used for reading the MSB/CSB pages when 2 bits are written to each cell.

iv. 3BpcThresholds—7 read thresholds used for reading the MSB/CSB/LSB pages when 3 bits are written to each cell.

Figure 13:
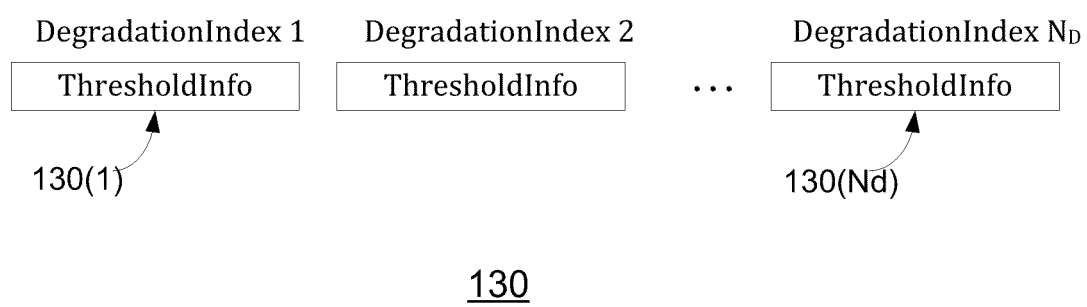
FIG. 13 schematically illustrates a multi dimensional data structure for storing read thresholds arranged according to degradation levels, according to an embodiment of the invention.

Reference is made to FIG. 13, which schematically illustrates a multi dimensional data structure 130 storing read thresholds arranged according to degradation levels according to an embodiment of the invention.

Data structure 130 may store a row vector (Nd×1) of basic data structures 130(1)-130(Nd). Each basic data structure 130($i$) may be associated with a different degradation level (DegradationIndex). Nd may be the number of potential different DegradationIndex values. Nd may be chosen not to exceed system memory constraints. In some embodiments, a wear leveling policy may be used to ensure that all the memory cells in a unit have approximately the same or similar number of program/erase cycles to limit the variation in read thresholds due to varying program/erase cycling.

Figure 14:
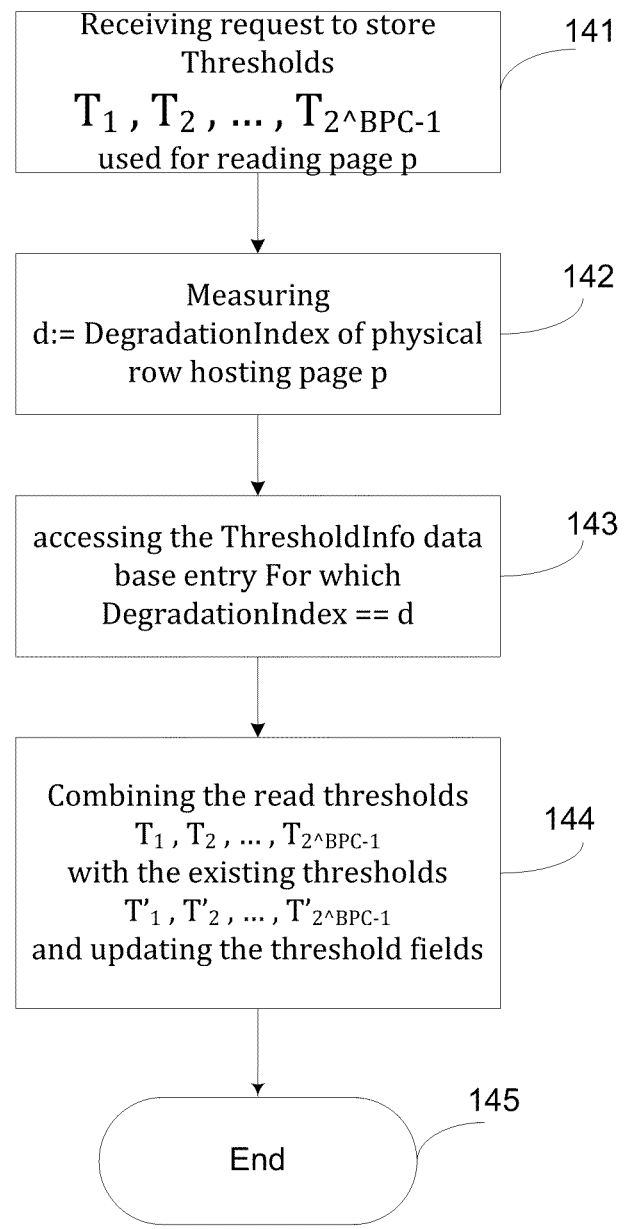
FIG. 14 is a flowchart of a method for storing read thresholds arranged according to degradation levels, according to an embodiment of the invention.

Reference is made to FIG. 14, which is a flowchart of a method 140 for storing read thresholds arranged according to degradation levels, according to an embodiment of the invention.

In operation 141, a request may be received to store a set of read thresholds used for reading a set of cells, such as, a page ("p"). To store the read thresholds of all bit pages in a memory device with a number of bits per cell (BPC), the set of read thresholds may include read thresholds T1, T2, . . . , T($2^{BPC}-1$). To store the read thresholds of an individual Mth page for the Mth bit of the cells, the set of read thresholds may include $2^{M-1}$ read thresholds.

In operation 142, the degradation level of the cells (d=DegradationIndex) may be measured for the set of cells, for example, as described in reference to FIG. 11B.

In operation 143, the basic data structure (e.g., data structure 130 of FIG. 13) (ThresholdInfo) that is associated with the degradation level d may be accessed to store a read threshold set previously used to read the cells.

In operation 144, the previously used read threshold set may be updated or combined with a new read threshold set. For example, the previously used read threshold set may be averaged with the new read threshold set or combined by any function of the two (e.g., a linear combination). The updated read threshold set may be stored in the basic data structure.

Operation 144 may be followed by an "END" operation 145.

Reference is made to FIG. 15, which is a flowchart of a method 150 for retrieving sets of read thresholds arranged according to degradation level, according to an embodiment of the invention.

In operation 151, a request may be received to retrieve a set of read thresholds used for reading a set of cells, such as, a page ("p").

In operation 152, the degradation level of the cells (d=DegradationIndex) may be measured for the set of cells, for example, as described in reference to FIG. 11A.

In operation 153, the basic data structure (e.g., data structure 130 of FIG. 3) (ThresholdInfo) that is associated with the degradation level d may be accessed to retrieve a read threshold set previously used to read the cells.

In operation 154, it may be determined if the previously used read thresholds are stored in the basic data structure. If so, a process or processor may proceed to operation 155; otherwise a process or processor may proceed to operation 156.

In operation 156, a search failure may be declared, e.g., "No Thresholds Found".

If the previous read thresholds are found, the set of read thresholds may be returned in operation 155.

Operations 155 and 156 may be followed by an "END" operation 158.

Adaptive Cycle Count Binning and Row Set Compensation

Different programming parameters (e.g., program levels) may be set, for example, depending on a number of previously executed program/erase cycles and/or a row index within the block to which writing is performed. Selection of programming parameters per cycle count and per row may be used, for example, as described in P.C.T patent application publication serial number WO/2009/053963, entitled "Methods for Adaptively Programming Flash Memory Devices and Flash Memory Systems Incorporating Same," which is assigned to the common assignee of the present Application and is incorporated by reference herein in its entirety.

Some embodiments of the invention may modify the data structure 130 of FIG. 13 to generate a three-dimensional data structure 160 of FIG. 16 defining different read thresholds sets for different cell partitions.

Reference is made to FIG. 16, which schematically illustrates a multi dimensional data structure 160 for storing different read thresholds sets for each cycle count and/or row index of a cell partition, according to an embodiment of the invention. Three-dimensional data structure 160 may be accessed using three keys defining three characteristic values for the cell partition, for example, a degradation level (Y-axis), program erase cycle value (X-axis denoted cycle count) and row set value (Z-axis). Alternatively, the Degradation Index may be concatenated to (or other wise combined with) with the cycle count index to provide a single index that will be used (directly or after being hashed) to provide a key to the three-dimensional data structure. This combining of indices may allow reducing the size of the three-dimensional data structure according to the number of cycle counts that simultaneously exist. Operations for storing and retrieving read thresholds based on a single characteristic of the cell partition (e.g., described in reference to FIGS. 5, 6, 9, 10, 14 and 15) may be modified to describe storing and retrieving read thresholds based on multiple (e.g., three) characteristics of the cell partition.

The row set value may define an index of a set of one or more physical rows of the memory partition. The row set value may account for different rows of the memory partition. The cycle count value may account for different cycle counts executed by the memory partition. The number of bins required along the cycle count axis may depend on a number of different programming parameter sets. For example, if a system is defined to support up to 5000 cycles, and uses different programming parameters for every interval of 500 cycles, then 10 bins are generally used. The number of row sets may depend on the behavior of groups of rows in the physical block after cycling and retention.

In some embodiments, a procedure of "wear leveling" may be activated for equalizing the number of cycles executed by each cell partition. Wear leveling may ensure that at any given time all the blocks or sets of cells in the memory device are, more or less, equally degraded, for example, within a predetermined maximum degradation range. As a result, at any given time the cycle count span of the blocks may be limited to a relatively small cycle range. Accordingly, the amount of memory used to read multi dimensional data structure 160 may be minimized or the memory used for the threshold data base may be used more efficiently.

In one example, if wear leveling decreases the cycle count range to, for example, 200 cycles, fewer bins may be allocated along the cycle count axis than allocated originally. For example, when the memory device is new, the values $C_{min}$, and $C_{max}$ in FIG. 16 may assume the values 0 and 200, respectively. After the memory reaches a state where all the blocks have cycled at least 200 times, these values may be changed to 200 and 400, respectively, and so on. In this way, the ThresholdInfo records adapt their degradation association to the wear state of the memory, and the threshold data structures efficiently stores all read thresholds which are relevant to current wear state of the memory device. In one embodiment, the difference between the program level distributions of different row sets before and after cycling and retentions may be modeled by more or less fixed voltage shifts which depend on the index of the program level. These voltage shifts may be fixed irrespective of cycle count and retention. Such embodiments may be combined with the threshold management system, for example, as follows.

Offline measurements may be conducted to assess the voltage shifts between pairs of rows. These values may then be stored in a differences data structure.

Next, when a read request is issued to read a page in a physical row for which no ThresholdInfo is found in the threshold data base, instead of declaring "No threshold found", the management system may search for a reference ThresholdInfo that is stored in the multi dimensional data structure and represents a reference page that is associated with another physical row of the memory module.

If such a reference value is found, the reference value may be modified by adding an associated shift from the differences data structure and the modified reference value may be provided for reading the requested page. In some memory devices, the shift of one row set with respect to another may vary with respect to either the voltage level or the degradation state of the memory partition. In one example, the voltage shift may be defined as shift=f (V), where V is the voltage level of a read threshold to be corrected. Thus, when the reference read thresholds are found for a neighboring row set, they may be corrected according to the formula above and used to read the cell partition. If the read operation is successful, these read thresholds may be stored in the corresponding row set to execute subsequent read instructions.

Embodiments of the invention may reduce the amount of memory required to store all relevant threshold information and may improve the efficient use of a given amount of memory allotted for threshold management. For example, any excess memory obtained by reducing threshold storage may be used to store other data, such as, more degradation bins, more row sets, etc.

Systems and Methods for Management of Read Thresholds Combining Several Approaches Management of read threshold retrieval may be based on an individual type of memory characteristic, for example, selected dynamically based on system parameters. For example, when the cell partition to be read is known, read thresholds may be searched for and retrieved based on a cell partition characteristic. Similarly, when writing and/or reading to cell partitions occurs at sporadic times (and simultaneously to a multitude of cell partitions), the read thresholds may be retrieved based on a timestamp characteristic. In another case, when writing and/or reading to cell partitions are performed to arbitrary block indices and at arbitrarily time instants, the read thresholds may be retrieved based on a degradation level characteristic.

In some systems, writing and reading to cell partitions occur in a variety of patterns. For example, certain blocks in a memory device (e.g., file allocation tables (FAT) blocks) may be accessed relatively frequently, whereas other blocks might be accessed less frequently. Some applications or users of applications may write and/or read a significant amount of data at sporadic times, while others may write and/or read smaller amounts of data but more frequently. In order to cope with such diverse usage patterns, embodiments of the invention may manage read threshold retrieval based on a combination of multiple characteristics. The optimal one or more characteristics used to manage read threshold retrieval may be changed or dynamically selected, for example, using adaptive programming, to search based on the characteristic(s) that optimize the efficiency of retrieving thresholds and/or reading. Given a memory constraint for the threshold management system, the amount of memory allotted for each component may be traded-off based on any a-priori knowledge regarding the read/write usage patterns.

Some embodiments of the present invention may improve the read threshold data (ThresholdInfo) stored in data structures (e.g., data structures 30, 70, 120 of FIGS. 3, 7, 12, respectively), for example, by replacing initial sets of read thresholds with new sets of read thresholds. In some embodiments, the initial sets of read thresholds records, which are replaced with new thresholds, may be retained up to a certain history level, after which they may be discarded. For example, each basic data structure (ThresholdInfo) may include read threshold values of previous sets of read thresholds. Alternatively, older values of sets of read thresholds may be stored in other separate data structures.

Tracking Optimal Read Thresholds Based on Read Threshold Perturbations

To evaluate the success of reading with a set of read threshold, the read result may be decoded (e.g., using ECC) and the number of errors (Nerr) detected during decoding may be evaluated. This number may be stored for future reference in the threshold management system. In one example, the ThresholdInfo structure may include an extra field (or fields) for storing the error count (Nerr) or a function thereof. In one example, the number of errors may be stored, for example, in a look-up-table, in metadata associated with the thresholds, or tagged or appended to the corresponding thresholds, and may be arranged, for example, based on a read characteristic, for example, BlockIndex, TimeStamp, CycleCount, RowSet, DegradationIndex, even/odd pages, bit type (MSB, CSB, or LSB), etc.

When a read instruction requests to read information from a cell partition, such as, a page, one or more read thresholds of a set of read thresholds with the same characteristic value(s) as the cell partition may be retrieved and slightly modified (e.g., perturbed in a certain direction). The magnitude of the perturbation and direction of the perturbation may be a function of the number of errors (Nerrs) generated in previous read operations using thresholds associated with the same characteristic value(s). A read operation may be performed using the perturbed set of read thresholds. If the read operation yields a successful error correction with a minimal number of error (Nerrs (i)), the same set of read thresholds may be stored and re-used for future reads. Otherwise, the set of read thresholds may be further perturbed iteratively with a voltage step predicted to decrease the number of error (Nerrs (I)) in the next read operation. The perturbed set of read thresholds and the number of errors may be stored for evaluating various sets of read thresholds.

Figure 17:
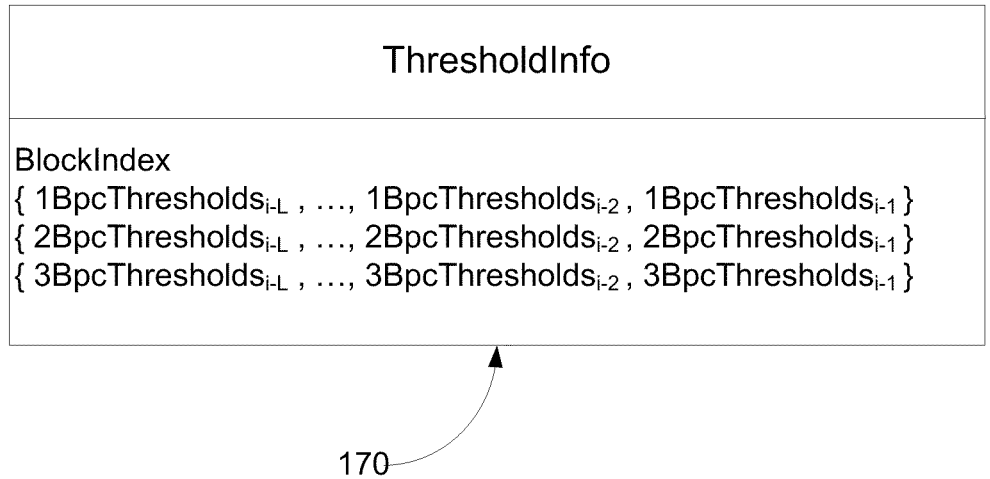
FIG. 17 schematically illustrates a data structure storing a history of read threshold data, according to an embodiment of the invention.

Reference is made to FIG. 17, which schematically illustrates a data structure 170 storing a read threshold history, according to an embodiment of the invention. Data structure 170 may be an atomic or basic data structure forming the smallest storage component in a memory device. Data structure 170 (ThresholdInfo) may include up to L versions of sets of read thresholds, for example, including the following information fields:

i. BlockIndex—The physical index of a cell partition in the memory module.

ii. 1BpcThresholds(i−1)—1BpcThresholds(i−L)—A last set till the (i−L)'th set of single read thresholds used for reading the MSB page when 1 bit is written to each cell.

iii. 2BpcThresholds(i−1)—2BpcThresholds(i−L)—A last set till the (i−L)'th set of 2BpcThresholds—each set includes 3 read thresholds used for reading the MSB/CSB pages when 2 bits are written to each cell.

iv. 3BpcThresholds(i−1)—3BpcThresholds(i−L)—A last set till the (i−L)'th set of 3BpcThresholds—each set includes 7 read thresholds used for reading the MSB/CSB/LSB pages when 3 bits are written to each cell.

Figure 18:
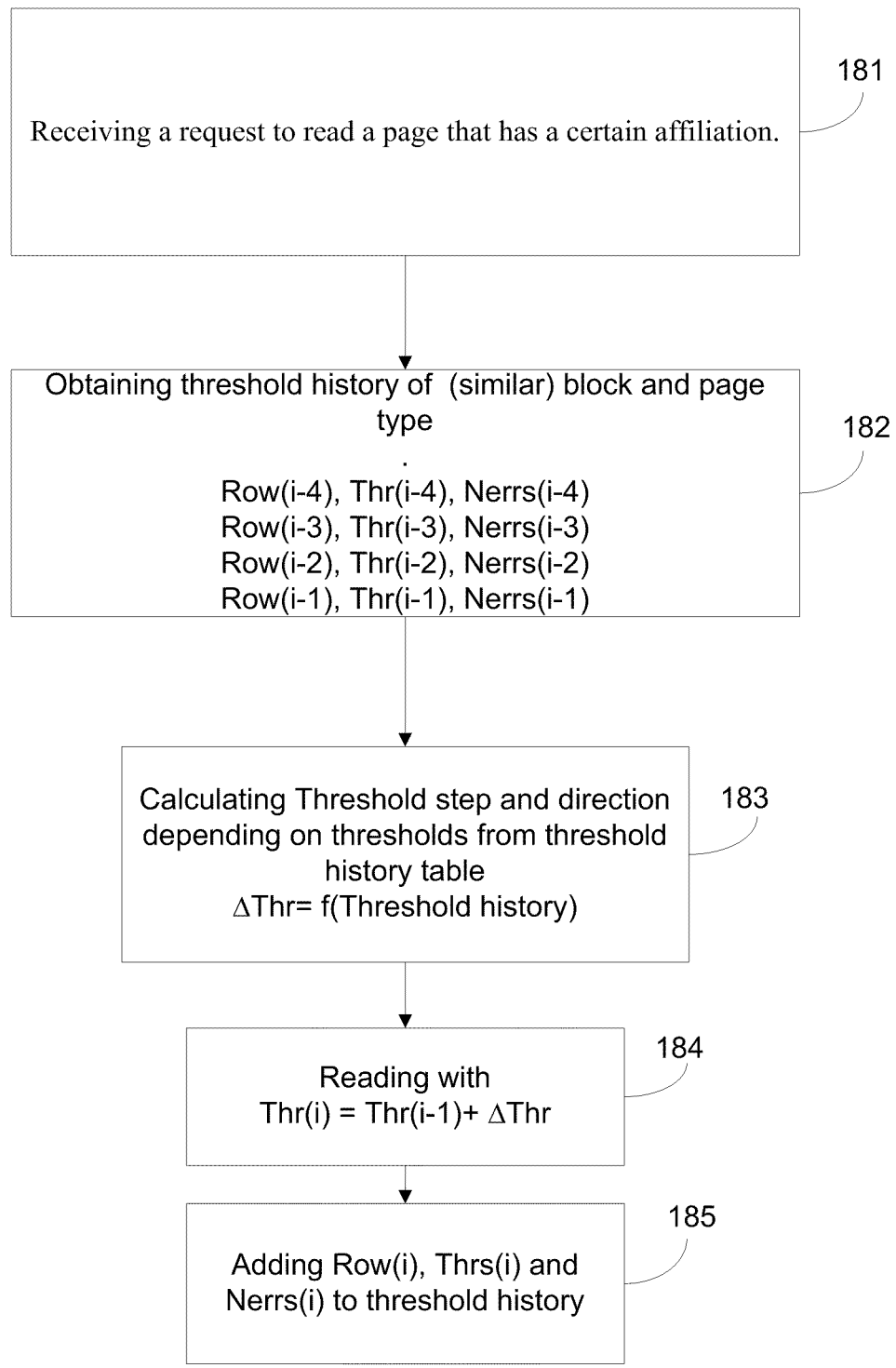
FIG. 18 is a flowchart of a method for perturbing a single read threshold, according to embodiments of the invention.

Reference is made to FIG. 18, which is a flowchart of a method 180 for perturbing a single read threshold, according to embodiments of the invention.

In operation 181, a request may be received to read a cell partition, such as, a page, having one or more identifying or characteristic value(s).

In operation 182, a threshold history of (L) previously used sets of thresholds used to read pages with the same one or more characteristic value(s) may be retrieved from storage (e.g., data structure 170 of FIG. 17). The thresholds history may, for example, include: (a) the last L read threshold sets associated with the characteristic value(s) (Thr(i−1, 2, . . . , L)), (b) the last L numbers of errors resulting from the last L read attempts (and error correction decoding) associated with the characteristic value(s) (Nerr(i−1, 2, . . . , L)), and (c) the cell partition (e.g., row) indices read during the last L read attempts associated with the characteristic value(s) (Row (i−1, 2, . . . , L)). In the example shown in FIG. 18, L=4, although any other number may be used for L. To read a cell partition from a memory unit with a number of bits per cell (BPC), each set of read thresholds may include (2^BPC−1) read thresholds.

In operation 183, a perturbation may be calculated having a voltage magnitude (threshold_step) and direction (increasing or decreasing read thresholds) in which to shift at least one threshold from a previously used set of thresholds in the threshold history to generate a new perturbed set of read thresholds. The magnitude and direction of the perturbation may be calculated based on a function of the read thresholds in the threshold history (e.g., ΔThr=f (Threshold history)).

For example, the voltage magnitude of the threshold step for each perturbed threshold may be a function of the number of errors generated in a previously used set of read thresholds (Nerr(i−1, 2, . . . , L)). The voltage direction may be incremented in an initial direction (e.g., initially decreasing to reflect charge loss due to cell degradation) and may remain incremented for each sequential read operation in the same direction when the number of read errors associated with the perturbation decreases and may change directions when the number of read errors associated with the perturbation increases.

An example of a function f (ΔThr=f(Threshold history)) for calculating the magnitude and direction of the perturbation based on the threshold history may be, for example, defined as follows:

| Value of s | condition |
| --- | --- |
| −1 | Thr(i-1) < Thr(i-2) |
| 0 | Thr(i-1) = Thr(i-2) |
| 1 | Thr(i-1) > Thr(i-2); |

| Value of ΔThr | condition |
| --- | --- |
| Basic_step | s = 0 |
| −s* basic_step | −α ≦ [Nerrs(i-1) − Nerrs(i-2)] ≦ α AND s <> 0 |
| s* basic_step | [Nerrs(i-1) − Nerrs(i-2)] <− α AND s <> 0 |
| −2*s* basic_step | α < [Nerrs(i-1) − Nerrs(i-2)] AND s <> 0 |

In the above function, α, may be a constant number defining a minimum difference in the number of errors that results in further perturbations to the threshold. In case there is no value i−2 in the threshold management system, the same values may be used for i−2 as for i−1. In general, the function for ΔThr may use more than two previous read results.

In operation 184, the cell partition may be read with the perturbed set of read thresholds.

In operation 185, the threshold history accessed in operation 182 may be updated with the perturbed set of read threshold Thr(i), an associated error number Nerrs(i) detected by error correction decoding the read result and an associated current cell partition index Row(i).

Method 180 may be applied for perturbing thresholds for each page individually. In one embodiment, to perturb the single threshold for a MSB page, embodiments of the invention may proceed, for example, as follows:

i. Operation 182 may include retrieving MSB read thresholds of previous MSB page reads for reads associated with the same characteristic value(s). Number of errors detected and row numbers from which the page is read may also be retrieved;

ii. Operation 183 may include determining, based on the sets of retrieved read thresholds, row numbers and number of errors, the MSB read threshold to be used with a current page read operation. The new MSB read threshold may be defined as a step (or perturbation) added to the last MSB read threshold found by a threshold management system (e.g., where the read threshold step (ΔThr) may be defined by any function).

iii. Operation 184 may include performing a (MSB) read operation with the perturbed MSB read threshold.

iv. Operation 185 may include recording the number of errors detected in the MSB page and storing the perturbed MSB read threshold, number of errors and row in the threshold management system.

It is noted that the read threshold history may include other fields than those mentioned above as well as additional fields or fewer fields. For example, the read threshold history may not include row number indices. In another example, the read threshold history may include the last value and an average value of previous values of read thresholds and/or error numbers. Thus, Thr(i−1) and Nerrs(i−1) may be compared, during operation 183 to average values of read thresholds and number of errors.

Accounting for Row Differences

In some memory devices (e.g., NAND Flash devices), different rows or other cell partitions may have known differences in numbers of errors. Some embodiments of the invention may compensate for such variation in error, for example, as follows:

| Value of ΔThr | condition |
| --- | --- |
| Basic_step | s = 0 |
| −s* basic_step | −α ≦ {[Nerrs(i-1) − Nerrs(i-2)]/Nrow} ≦ α AND s <> 0 |
| s* basic_step | {[Nerrs(i-1) − Nerrs(i-2)]/Nrow} <− α AND s <> 0 |
| −2*s* basic_step | α < {[Nerrs(i-1) − Nerrs(i-2)]/Nrow} AND s <> 0 |

In such embodiments, perturbations for read thresholds may have a magnitude and direction defined by the row number (Nrow) in the error metric.

Perturbation of Thresholds of CSB and LSB Pages

Figure 19:
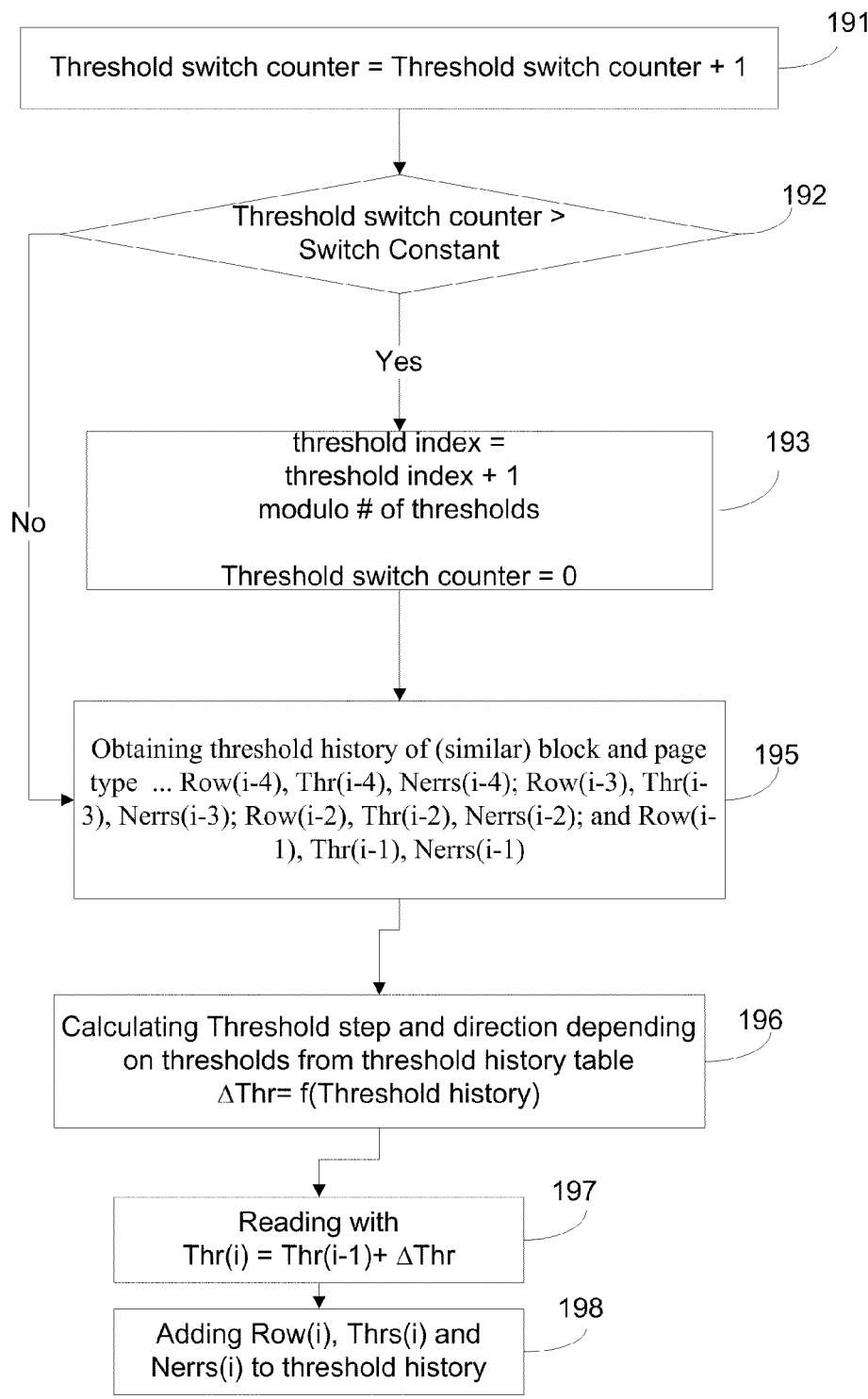
FIG. 19 is a flowchart of a method for perturbing multiple read thresholds, according to embodiments of the invention.

The method described in reference to FIG. 18 which perturbs a single read threshold (e.g., for reading an MSB page) may be generalized in FIG. 19 for perturbing multiple read threshold (e.g., for reading CSB and/or LSB pages). In one embodiment, a different read threshold (e.g., differentiating different states for the page bit) may be perturbed in each different read operation. For example, to read a CSB page, the first read threshold to be perturbed may be the lowest read threshold, followed by the higher read threshold in the next read operation.

Reference is made to FIG. 19, which is a flowchart of a method 190 for perturbing multiple read thresholds, according to embodiments of the invention.

Operations 191-193 may determine the order in which the multiple read thresholds are scheduled to be perturbed (e.g., in a round robin manner). A new read threshold index (i) may be chosen for every "switch constant" read operation for the same page characteristic value(s). This may require storing a "Read threshold switch counter" for each set of different characteristic value(s). This selection of read thresholds may provide sufficient historic read threshold information to enable a sufficiently accurate method for tracking optimal read thresholds.

In operation 191, a threshold counter may be incremented, for example, Threshold switch counter=Threshold switch counter+1.

In operation 192, it may be determined whether the threshold counter exceeds a predetermined switch constant. If so, a process or processor may proceed to operation 193; otherwise a process or processor may proceed to operation 195.

In operation 193, the threshold counter (i) may be re-set (e.g., Threshold switch counter=Threshold index+1 (modulo # thresholds in the current page)=0). Threshold (i) having the counter index may be perturbed.

In operation 195, a threshold history of (L) previously used sets of thresholds, for example, used to read pages with the same one or more characteristic value(s) as the present memory partition being read, may be retrieved from storage (e.g., data structure 170 of FIG. 17). The thresholds history may, for example, include: (a) the last L read threshold sets associated with the characteristic value(s) (Thr(i−1, 2, . . . , L)), (b) the last L numbers of errors resulting from the last L read attempts (and error correction decoding) associated with the characteristic value(s) (Nerr(i−1, 2, . . . , L)), and (c) the cell partition (e.g., row) indices read during the last L read attempts associated with the characteristic value(s) (Row (i−1, 2, . . . , L)). To read a cell partition from a memory unit with a number of bits per cell (BPC), each set of read thresholds may include ($2^{BPC}-1$) read thresholds.

In operation 196, a perturbation may be calculated for the selected read threshold (i) having a perturbation magnitude (threshold_step) and direction (increasing or decreasing read thresholds) in which to shift the threshold (i) from a previously used set of thresholds in the threshold history to generate a new perturbed set of read thresholds. The magnitude and direction of the perturbation may be calculated based on a function of the read thresholds in the threshold history (e.g., $\Delta Thr = f$ (Threshold history)).

In operation 197, the cell partition may be read with the perturbed set of read thresholds, for example, including the (ith) perturbed threshold: $Thr(i) = Thr(i-1) + \Delta Thr$.

In operation 198, the threshold history accessed in operation 195 may be updated with at least the perturbed threshold (Thr(i)), associated error number Nerrs(i) detected by error correction decoding of the read result and/or a current cell partition index Row(i).

Method 190 may be incremented to and repeated to perturb each different read threshold.

According to an embodiment of the invention, an optimal value for each threshold may be tracked in parallel, for example, by differentiating between errors that occurred around different read thresholds. Such embodiments may be implemented by reading the values programmed to relatively lower pages (e.g., MSB and CSB in the case of reading a LSB page and MSB in the case of reading a CSB page). For example, in a CSB page with two thresholds, errors may be differentiated that occurred due to the first or second thresholds by reading the MSB bits that correspond to the error locations. The number of errors that occurred due to the first and second threshold may be counted separately, for example, as Nerrs(threshold_1) and Nerrs(threshold_2), respectively. Accordingly, both the first or second thresholds may be perturbed simultaneously. In another example, in an LSB page with four thresholds, each different LSB read thresholds may be examined in parallel by differentiating between errors that occurred in each of the four LSB read thresholds by reading the corresponding bits in the MSB and CSB pages.

According to an embodiment of the invention, the read threshold history may be updated by adding the number of errors that occurred from 0 to 1 and those that occurred from 1 to 0.

Tracking Optimal Read Thresholds Based on Perturbed Reread and Decoding of Same Page According to an embodiment of the invention, after read threshold(s) are perturbed, the perturbation may be evaluated by re-reading and decoding the memory using the perturbed read threshold(s). Evaluating each perturbation may reduce bias due to difference between the page that is read and the other page that is re-read and may reduce bias introduced during a time that lapsed from reading the different pages.

Figure 20:
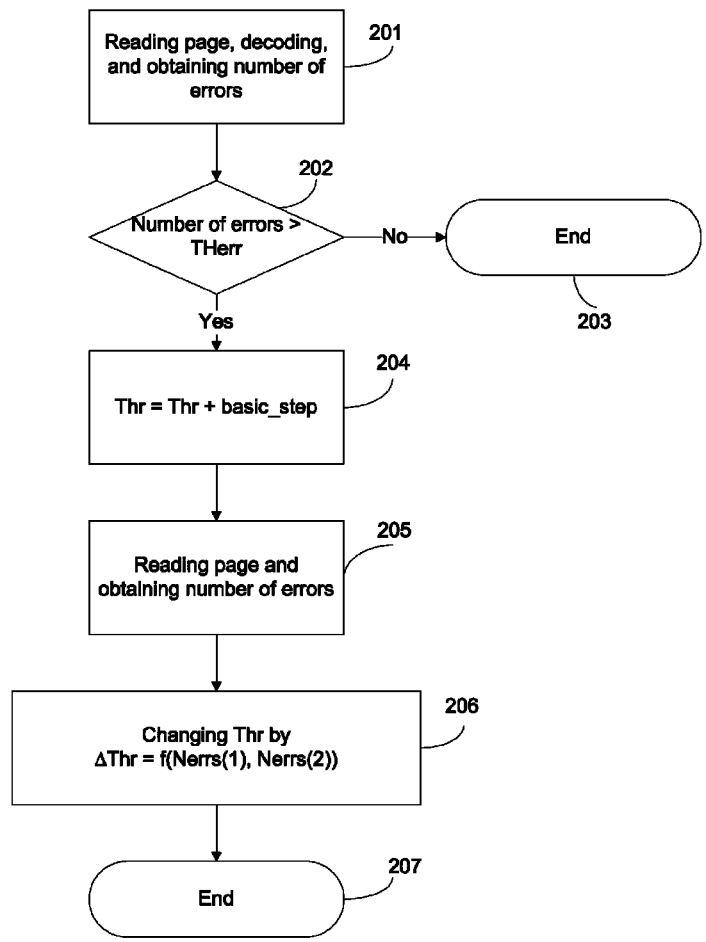
FIG. 20 is a flowchart of a method for tracking optimal read thresholds based on perturbations of a single read threshold using multiple reading and decoding operations, according to embodiments of the invention.

Reference is made to FIG. 20, which is a flowchart of a method 200 for tracking optimal read thresholds based on perturbations of a single read threshold using multiple reading and decoding operations, according to an embodiment of the invention.

In operation 201, a page may be read, decoded using error correction, and the number of errors corrected by decoding may be counted.

In operation 202, the number of counted errors may be compared to a predetermined error threshold (THerr). If the number of counted errors is lower than the predetermined error threshold, the read result and the read thresholds may be determined to be sufficiently accurate, and method 200 may terminate at operation 203. Otherwise, the process may proceed to operation 204.

In operation 204, the read threshold may be perturbed by adding a small step: Thr=Thr+basic_step. Operation 204 may include perturbing the read threshold by reducing the basic_step. The amount of change and the direction of the perturbation (basic_step) may be responsive to previous read results.

In operation 205, the page may be read using the perturbed read thresholds, applying error correction decoding and counting a new number of errors corrected by decoding.

In operation 206, the read threshold may be modified (if necessary) based upon a function of the number of errors obtained in the first read operation 201 and the second read operation 205.

Operation 206 may be followed by an "END" operation 207.

Embodiments of the invention described in reference to FIG. 20 to perturb a single read threshold, may also be used to perturb multiple read thresholds, for example, in each page of the CSB and LSB pages. In this case multiple re-read and error correction decoding iterations may be used. In one example, one or more read thresholds may be perturbed between read and re-read operations 201 and 205. Additionally or alternatively, instead of counting the overall number of errors read using the perturbed threshold set, errors may be counted and processed that are individually associated with each read threshold.

Figure 21:
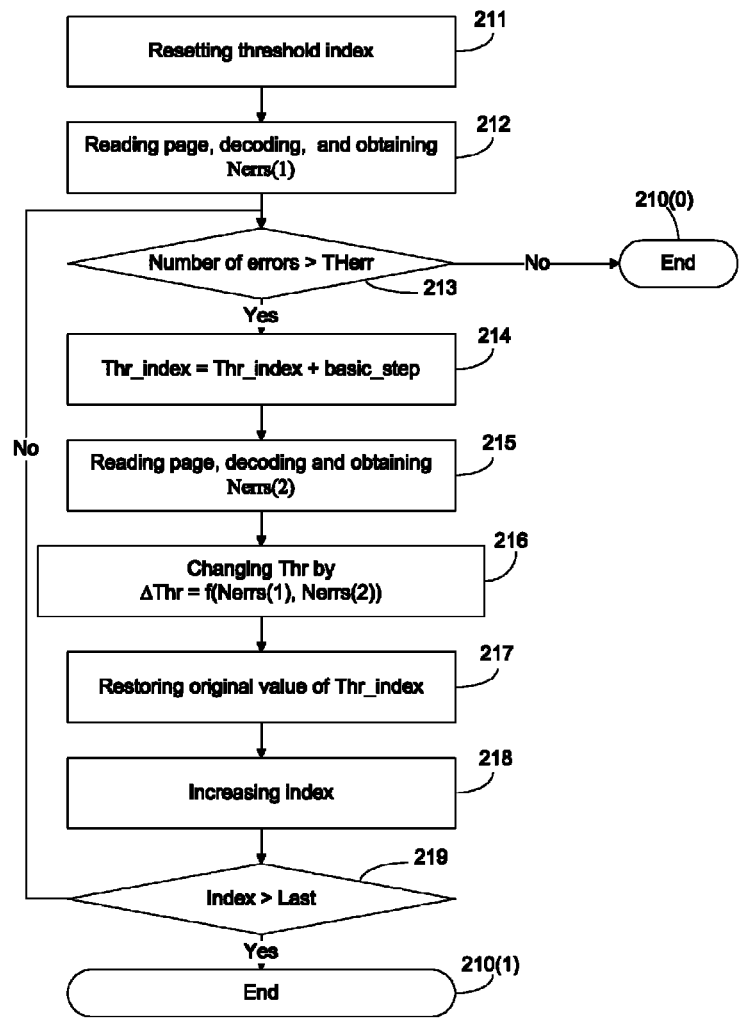
FIGS. 21 and 22 are flowcharts of methods for tracking optimal read thresholds based on perturbations of multiple read thresholds using multiple reading and decoding operations, according to various embodiments of the invention.
Figure 22:
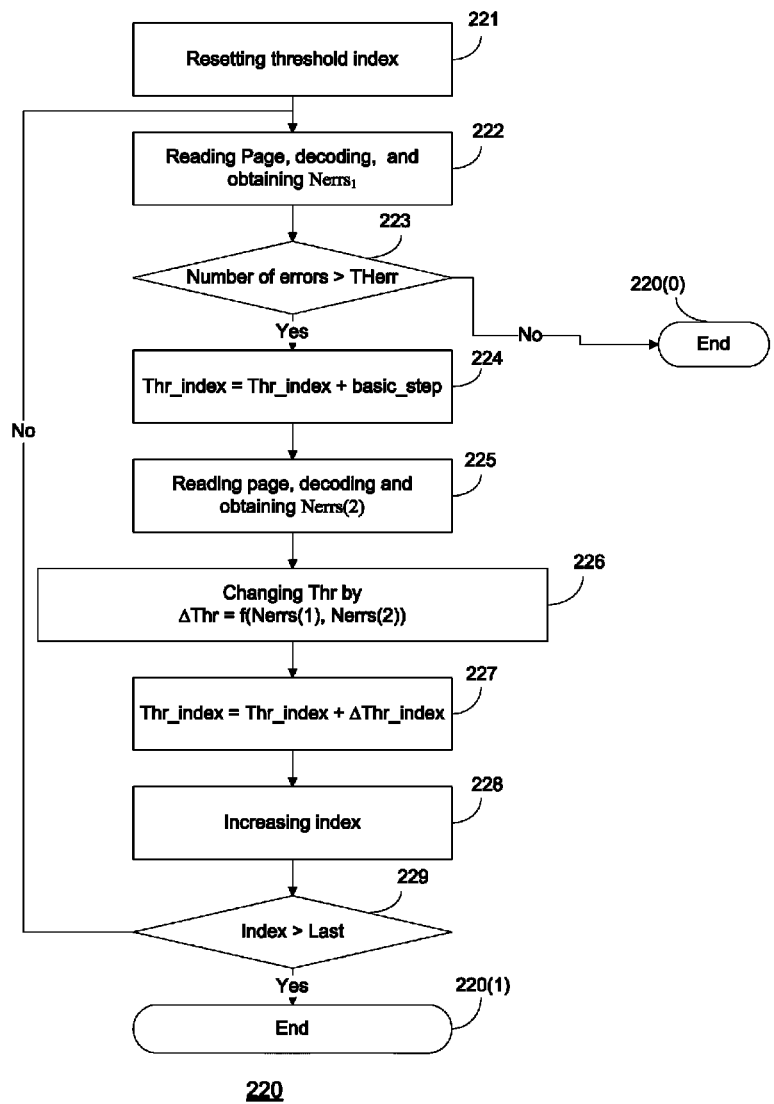

Reference is made to FIGS. 21 and 22, which are flowcharts of methods 210 and 220 for tracking optimal read thresholds based on perturbations of multiple read thresholds using multiple reading and decoding operations according to various embodiments of the invention.

Method 210 may include perturbing k read thresholds and performing a single read operation and k re-read operations. Method 220 may include perturbing k read thresholds and performing 2k read operations. Method 220 includes k iterations of the operations of method 200, wherein each iteration inputs a corrected read threshold output by the previous iteration. Although method 220 uses more read operation than method 210 (e.g., 2k instead of k+1), method 220 may generate relatively more accurate read threshold estimates than method 210.

In FIG. 21, operation 211 may initiate by resetting a threshold index used to select a read threshold to be perturbed.

In operation 212, a page may be read, decoded using error correction, and the number of errors corrected by decoding may be counted. This number of errors may be denoted, for example, as Nerrs(1) and may be associated with the original (un-perturbed) read threshold.

In operation 213, the number of counted errors may be compared to a predetermined error threshold (THerr). If the number of counted errors is lower than the predetermined error threshold, the read result and the read thresholds may be determined to be sufficiently accurate, and method 210 may terminate at operation 210(0). Otherwise, the process may proceed to operation 214.

In operation 214, the read threshold may be perturbed by adding a small step: Thr_index=Thr_index+basic_step. Operation 214 may include perturbing the read threshold by reducing the basic_step. The amount of change and the direction of the perturbation (basic_step) may be responsive to previous read results. Thr_index may define the currently evaluated read threshold associated with the current value of the threshold index initiated in operation 211 and updated in operation 218.

In operation 215, the page may be re-read using the perturbed read thresholds, applying error correction decoding and counting a new number of errors corrected by decoding. This number of errors may be denoted, for example, as Nerrs (2) and may be associated with the perturbed read threshold generated in operation 214.

In operation 216, the read threshold may be modified (if necessary) based upon a function of the number of errors Nerrs(1) obtained in the first read operation 212 and the number of errors Nerrs(2) obtained in the second read operation 215.

In operation 217, the original value of the threshold index may be restored.

In operation 218, the threshold index may be increased (in order to evaluate another read threshold during the next repetition of operations 213-217).

In operation 219, it may be determined if all read thresholds were evaluated (e.g., if threshold index>last). If so, method 210 may terminate at operation 210(1). Otherwise, the process may return to operation 213.

In FIG. 22, operation 221 may initiate by resetting a threshold index used to select a read threshold to be perturbed.

In operation 222, a page may be read, decoded using error correction, and the number of errors corrected by decoding may be counted. This number of errors may be denoted, for example, as Nerrs(1) and may be associated with the original (un-perturbed) read threshold.

In operation 223, the number of counted errors may be compared to a predetermined error threshold (THerr). If the number of counted errors is lower than the predetermined error threshold, the read result and the read thresholds may be determined to be sufficiently accurate, and method 220 may terminate at operation 220(0). Otherwise, the process may proceed to operation 224.

In operation 224, the read threshold may be perturbed by adding a small step: Thr_index=Thr_index+basic_step. Operation 224 may include perturbing the read threshold by reducing the basic_step. The amount of change and the direction of the perturbation (basic_step) may be responsive to previous read results. Thr_index may define the currently evaluated read threshold associated with the current value of the threshold index initiated in operation 221 and updated in operation 228.

In operation 225, the page may be re-read using the perturbed read thresholds, applying error correction decoding and counting a new number of errors corrected by decoding. This number of errors may be denoted, for example, as Nerrs (2) and may be associated with the perturbed read threshold generated in operation 224.

In operation 226, the read threshold may be modified (if necessary) based upon a function of the number of errors Nerrs(1) obtained in the first read operation 222 and the number of errors Nerrs(2) obtained in the second read operation 225 (e.g., as $\Delta$Thr_index=f(Nerrs(1), Nerrs(2))).

In operation 227, the original value of the threshold index may be incremented or perturbed again by adding a step: Thr_index=Thr_index+$\Delta$Thr_index.

In operation 228, the threshold index may be increased (in order to evaluate another read threshold during the next repetition of operations 223-227).

In operation 229, it may be determined if all read thresholds were evaluated (e.g., if threshold index>last). If so, method 229 may terminate at operation 220(1). Otherwise, the process may return to operation 222.

Methods 210 and/or 220 may be modified by re-reading a portion or subset of the cells in a page, for example, if the error correction decoder may decode a portion of the page. In such cases, errors introduced by a page portion (and not the entire page) may be compared, for example, to save some decoding and reading operations associated with the remaining portions of the entire page.

Tracking Optimal Read Thresholds Based on Counting the Number of Memory Cell Instances According to another embodiment of the invention, read threshold for a set of cells may be evaluated based on the PDF of the cells and the numbers of cells that store different voltage values. Thus, a number of memory cells may be associated with a given read threshold level instead of performing a re-read operation and an error correction decode operations. The number of memory cells associated with a given read threshold level may be counted before and after the error correction decoding and the outcomes of these two counting operations may be compared with each other in order to decide which (if any) read thresholds should be perturbed. The comparison may also indicate the magnitude and/or direction of change to perturb the one or more read thresholds.

Figure 23:
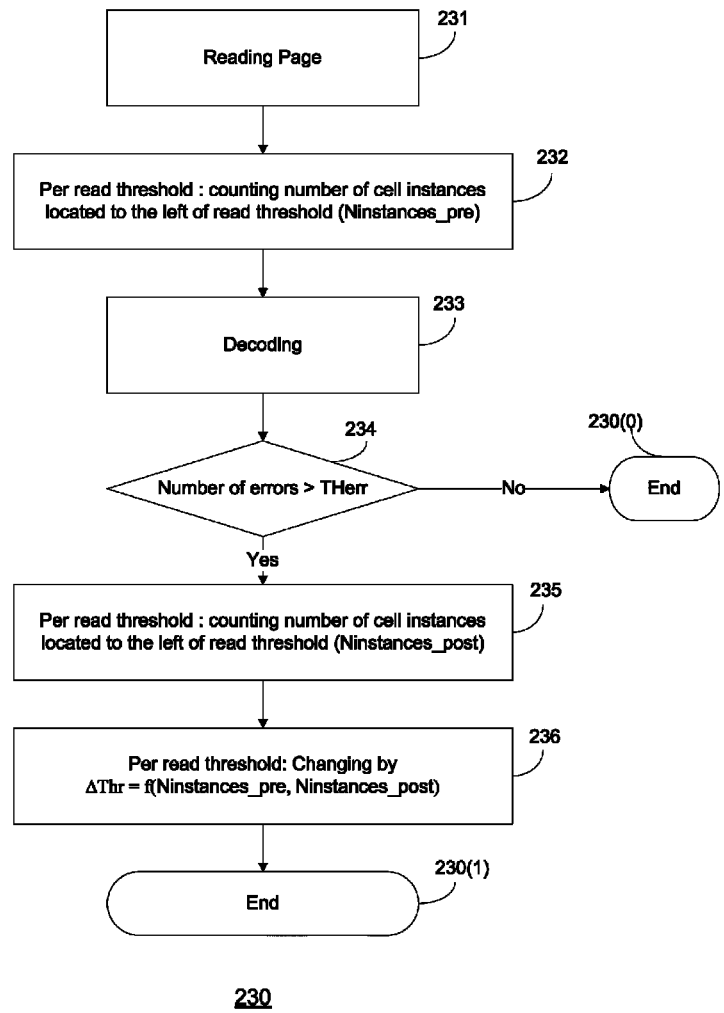
FIG. 23 is a flowchart of a method for tracking optimal read thresholds based on counting cell instances for each read threshold, according to embodiments of the invention.

Reference is made to FIG. 23, which is a flowchart of a method 230 for tracking optimal read thresholds based on counting cell instances for each read threshold according to various embodiments of the invention.

In operation 231, a page may be read using an initial set of read thresholds.

In operation 232, for each read threshold, a number of memory cells may be counted that store values associated with a lower voltage range than the read threshold. These numbers may collectively be denoted, for example, as Ninstances_pre.

Counting such numbers for some higher order pages (e.g., CSB and LSB pages) may include comparing read results for relatively lower order pages (e.g., MSB pages). In one example, an MSB read threshold may use a single count, for example, counting the number of memory cells that store "1" in an MSB read result. For the first CSB read threshold, the number of CSB bits equal to 1 and corresponding MSB bits equal to 1 may be counted. For the second CSB read threshold, the number of CSB bits equal to 0 and corresponding MSB bits equal to 0 may be counted. Alternatively, for the second CSB read threshold, the number of CSB bits equal to 0 may be counted and this number may be added to the count obtained for the first CSB read threshold. For the first LSB read threshold, the number of LSB bits equal to 1 for each of LSB read, CSB read and MSB read may be counted. For the second LSB read threshold, the number of bits equal 0 for LSB read, equals 0 for CSB read and equal to 1 for MSB read may be counted. For the third LSB read threshold, the number of bits equal to 1 for LSB read, equal to 0 for CSB read and equal to 0 for MSB read may be counted. For the fourth LSB read threshold, the number of bits equal to 0 for LSB read, equal to 1 for CSB read and equal to 0 for MSB read may be counted.

In one embodiment, if the numbers of values are counted before the error correction decoding, the numbers refer to the numbers of cells to the left of the evaluated read threshold and to the right of a next read threshold (if one exists). However, if the numbers of values are counted after decoding, the numbers may not necessarily relate to the read thresholds.

In operation 233, the page may be decoded, which may, for example, include correcting errors. The number of errors corrected may be counted.

In operation 234, the number of counted errors may be compared to a predetermined error threshold (THerr). If the number of counted errors is lower than the predetermined error threshold, the read result and the read thresholds may be determined to be sufficiently accurate, and method 230 may terminate at operation 230(0). Otherwise, the process may proceed to operation 235.

In operation 235, for each read threshold, a number of memory cells may be counted after or post-decoding that store values associated with a lower voltage range than the read threshold. These numbers may collectively be denoted, for example, as Ninstances_post.

In operation 236, each read threshold may be modified (if necessary) based on a comparison between the number of errors related to the present read threshold before error correction decoding (Ninstances_pre) and the number of errors related to the present read threshold after the error correction decoding (Ninstances_post) (e.g., as $\Delta Thr = f(Ninstances\_pre, Ninstances\_post)$). In some embodiments, operation 236 may also use additional information, such as, historic read threshold results or additional information related to the PDF, to determine each read threshold modification.

An example of a function f(Ninstances_pre, Ninstances_post) for calculating the magnitude and direction of the perturbation based on the error count before and after decoding may be, for example defined as follows:

| Value of $\Delta Thr$ | condition |
|---|---|
| Basic_step | Ninstances(pre) − Ninstances(post) < −α |
| −basic_step | Ninstances(pre) − Ninstances(post) > α |
| 0 | −α <= Ninstances(pre) − Ninstances(post) <= α |

Operation 236 may be followed by an "END" operation 230(1).

According to an embodiment of the invention instead of reading and decoding an entire page, method 230 may read and decode only a portion of a page, for example, to increase the speed of achieving an accurate read result.

Reference is made to FIG. 24, which schematically illustrates a system 240, according to embodiments of the invention.

System 240 may include a memory module 241 having multiple (J) memory partitions 241(1), 241(2) . . . 241(J) and a memory controller 242 coupled to memory module 241. In one example, memory module 241 may be a Flash memory unit.

Memory controller 242 may include an interface 247, a management module 243, a read circuit 245 and an offset circuit 246.

Interface 247 may be adapted to receive a current read instruction for reading information from a memory partition 241(i) in memory module 241.

Management module 243 may be adapted to manage data structures (e.g., data structures 40, 80, 130, or 160 of FIG. 4, 8, 13, or 16) storing sets of read thresholds each used to successfully execute a previous read instruction. The sets of read thresholds may be stored based on values of one or more characteristics (e.g., cell block, timestamp, degradations level, etc.) of a (same or different) memory partition 241(k) read in the previous read instruction.

Memory controller 242 may be adapted to search the data structure for a set of read thresholds associated with the same or similar characteristic values as the memory partition 241(i) defined in the current read instruction. The read thresholds may be thresholds previously used to successfully execute a previous read instruction, an initial set of thresholds adapted for reading but which have not yet been used to read, or thresholds generated in a training procedure. Memory controller 242 may search the data structure using one or more values of one or more characteristics of the memory partition 241(i) as keys to the data structure.

Read circuit 245 may be adapted to read the memory partition 241(i) defined in the current read instruction using the found set of previously used read thresholds, if the thresholds are found.

However, if the thresholds are not found, offset circuit 246 may be adapted to calculate a new set of read thresholds for the memory partition 241(i). In one embodiment, the new set of read thresholds may be calculated based on (a) a reference set of read thresholds associated with a reference memory partition, and (b) a set of predetermined differences between the set of read threshold of the memory partition 241(i) and the reference set of read thresholds. In another embodiment, for each read threshold characteristic or partition, the new set of read thresholds may be calculated by incrementally perturbing the voltage(s) of one or more thresholds in the retrieved set of read thresholds for each sequential read operation.

Reference is made to FIG. 25, which schematically illustrates a system 250, according to embodiments of the invention.

System 250 may include memory module 251 having (J) memory partitions 251(1), 251(2) . . . 251(J) and memory controller 252 coupled to memory module 251.

Memory controller 252 may include interface 257, management module 253, error evaluation circuit 258, read circuit 255 and read threshold perturbation module 259.

Interface 257 may be adapted to receive a current read instruction for reading information from a memory partition 251(i) in memory module 251.

Management module 253 may be adapted to retrieve an initial set of read thresholds for reading memory partition 251(i). The initial set of read thresholds may include new thresholds or previously used thresholds. In one example, management module 253 may retrieve previously used thresholds from a data structure storing a threshold history including sets of read thresholds previously used to successfully read different memory partitions in memory module 251.

If management module 253 detects errors in reading memory partition 251(i) using the initial set of read thresholds, read threshold perturbation module 259 may perturb at least one read threshold in the initial set of read thresholds to generate a perturbed set of read thresholds. Read threshold perturbation module 259 may perturb each individual read threshold individually, one-at-a-time, or multiple read thresholds, in parallel.

Read circuit 255 may be adapted to read the memory partition 251(i) defined in the current read instruction using the perturbed set of read thresholds to provide a read result.

Error evaluation circuit 258 may be adapted to evaluate the accuracy of the read result generated using the perturbed set of read thresholds by evaluating errors associated with the read result.

Management module 253 may be adapted to update the read threshold history by at least the perturbed set of read thresholds, for example, if the evaluated errors are minimal, such as within a predetermined error range.

Systems 240 and 250 may be used to execute any of the methods described herein and may store any of the data structures described herein. Systems 240 and 250 may include additional or fewer components and components depicted may be combined or separated. Systems 240 and 250 may be combined.

According to various embodiments of the invention operations from different mentioned above methods (and even entire methods) may be combined.

It may be appreciated that multi dimensional and basic data structures are described herein as an example of a storage structure and are not meant to be limiting. For example, a different multi dimensional data structure may be provided for each type of read operation or type of memory cell (e.g., 1 pbc, 2 bpc and 1 bpc). Additionally or alternatively, different multi dimensional data structures of different arrangements may be used.

Embodiments of the invention may be software-implemented using dedicated instruction(s) (e.g., retrieved via interface 247 and 257 of FIGS. 24 and 25, respectively) or, alternatively, hardware-implemented using designated circuitry (e.g., circuitry 243, 245, 246, and 247 of FIG. 24 and circuitry 253, 255, 257, 258, and 259 of FIG. 25).

Embodiments of the invention may include an article such as a computer or processor readable non-transitory storage medium, or a computer or processor storage medium, such as for example a memory, a disk drive, or a USB flash memory, for encoding, including or storing instructions which when executed by a processor or controller (for example, memory controller 242 and 252 of FIGS. 24 and 25, respectively), carry out methods disclosed herein.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

What is claimed is:

1. A method for reading information from a memory unit, the method comprising:
   receiving a request to read information from a set of memory cells in the memory unit;
   perturbing at least one read threshold in an initial set of read thresholds to generate a perturbed set of read thresholds;
   reading the set of memory cells using the perturbed set of read thresholds to provide a read result; and
   evaluating the performance of said reading using the perturbed set of read thresholds.

2. The method of claim 1, wherein, for each sequential read operation that is evaluated with sub-optimal performance, iteratively perturbing the at least one read threshold by a voltage step for reading the same cells or different cells with the same characteristics in a next sequential read operation.

3. The method of claim 1, wherein the at least one read threshold is perturbed by a voltage step with a magnitude and direction that is a function of past performance of reading using the at least one read threshold.

4. The method of claim 1, wherein the at least one read threshold is perturbed by a voltage step with a magnitude and direction that is a function of read thresholds stored in a read threshold history adapted to read the same cells or different cells with the same characteristics.

5. The method of claim 1, wherein the at least one read threshold is perturbed by a voltage step with a magnitude and direction that is a function of the row number of the set of memory cells.

6. The method of claim 1, wherein the at least one read threshold is perturbed by a voltage step with a direction that remains constant in subsequent read operations when the performance of said reading improves between previous and current read operations and is switched in subsequent read operations when the performance of said reading worsens between previous and current read operations.

7. The method of claim 1, wherein the performance of said reading is measured by counting the number of errors associated with the result of said reading in an error correction decoding operation.

8. The method of claim 7, wherein optimal performance occurs when the number of errors counted is less than a predetermined threshold and sub-optimal performance occurs when the number of errors counted is greater than a predetermined threshold.

9. The method of claim 1, wherein the performance of said reading is measured by counting the number of cells in the set of memory cells associated with a given read threshold before and after an error correction decoding operation and comparing the respective numbers of cells.

10. The method of claim 9, wherein optimal performance occurs when a difference between the numbers of cells counted before and after the error correction decoding operation is less than a predetermined threshold and sub-optimal performance occurs when the difference between the numbers of cells counted before and after the error correction decoding operation is greater than a predetermined threshold.

11. The method of claim 1 comprising perturbing each individual read threshold separately.

12. The method of claim 1 comprising perturbing multiple read thresholds in parallel.

13. The method of claim 12 comprising independently evaluating the performance of each of the multiple read thresholds separately and independently perturbing each of the multiple read thresholds according to their respective performances.

14. The method of claim 13, wherein the set of memory cells are multi-level cells and each cell level is programmed using a different programming page, wherein errors associated with different thresholds in a certain level page are differentiated by reading the bits of a relatively lower level page corresponding to the different error locations.

15. The method of claim 1 comprising retrieving the initial set of read thresholds from a data structure storing a read threshold history including sets of read thresholds previously used to successfully read different sets of memory cells in the memory unit; and
   updating the read threshold history by at least the perturbed set of read thresholds.

16. The method of claim 15, comprising obtaining the read threshold history from a data structure using a value of one or more characteristic of the set of memory cells as a key to the data structure.

17. The method of claim 1, wherein each of the initial and perturbed sets of read thresholds includes $2^{M-1}$ read thresholds for reading an Mth bit in the set of memory cells or $2^N-1$ read thresholds for reading all bits in the set of memory cells in an N-bits per cell memory unit.

18. The method of claim 1 comprising iteratively tracking at least one potentially varying optimal read threshold voltage in each sequential read operation to iteratively perturb the at least one read threshold to approximate the optimal voltage.

19. The method of claim 18, wherein a single optimal read threshold voltage is tracked using multiple reading and decoding operations to perturb the one read threshold.

20. The method of claim 18, wherein multiple optimal read threshold voltages are tracked using multiple reading and decoding operations to perturb multiple read thresholds.

21. The method of claim 1 comprising, for each read threshold in the set of multiple read thresholds, an iteration of:
perturbing a read threshold of the set of read thresholds that is associated with the set of memory cells to provide the perturbed set of read thresholds;
reading the set of memory cells using the perturbed set of read thresholds to provide a read result; and
evaluating a number of errors associated with the read result.

22. A method for reading information from a flash memory, the method comprising:
receiving a request to read a certain flash memory partition;
obtaining a read threshold history about sets of read thresholds that were used during at least one previous read operation of at least one flash memory partition that has a same value of a flash memory partition characteristic as the certain flash memory partition;
perturbing at least one read threshold of a set of read thresholds that is associated with the certain flash memory partition to provide a perturbed set of read thresholds;
reading the certain flash memory partition using the perturbed set of read thresholds to provide a read result;
evaluating the performance of said read result; and
updating the read threshold history by at least the perturbed set of read thresholds.

23. The method of claim 22, wherein, if the performance of said read result is sub-optimal, perturbing at least one read threshold in the perturbed set of read thresholds before updating the read threshold history.

24. A system comprising:
a memory unit including multiple sets of memory cells;
a memory controller, coupled to the memory unit, to receive a request to read information from a set of memory cells in the memory unit;
an offset circuit to perturb at least one read threshold in an initial set of read thresholds to generate a perturbed set of read thresholds;
a read circuit to read the set of memory cells using the perturbed set of read thresholds to provide a read result; and
an error evaluation circuit to evaluate the performance of said reading using the perturbed set of read thresholds.

25. The system of claim 24, wherein, for each sequential read operation that is evaluated with sub-optimal performance, the offset circuit iteratively perturbs the at least one read threshold by a voltage step for reading the same cells or different cells with the same characteristics in a next sequential read operation.

26. The system of claim 24, wherein the offset circuit perturbs the at least one read threshold by a voltage step with a magnitude and direction that is a function of past performance of reading using the at least one read threshold.

27. The system of claim 24, wherein the offset circuit perturbs the at least one read threshold by a voltage step with a magnitude and direction that is a function of read thresholds stored in a read threshold history adapted to read the same cells or different cells with the same characteristics.

28. The system of claim 24, wherein the offset circuit perturbs the at least one read threshold by a voltage step with a magnitude and direction that is a function of the row number of the set of memory cells.

29. The system of claim 24, wherein the offset circuit perturbs the at least one read threshold by a voltage step with a direction that remains constant in subsequent read operations when the error evaluation circuit evaluates the performance of said reading to improve between previous and current read operations and is switched in subsequent read operations when the error evaluation circuit evaluates the performance of said reading to worsen between previous and current read operations.

30. The system of claim 24, wherein the error evaluation circuit evaluates the performance of said reading by counting the number of errors associated with the result of said reading in an error correction decoding operation.

31. The system of claim 30, wherein optimal performance occurs when the error evaluation circuit counts a number of errors less than a predetermined threshold and sub-optimal performance occurs when the error evaluation circuit counts a number of errors greater than a predetermined threshold.

32. The system of claim 24, wherein the error evaluation circuit evaluates the performance of said reading by counting the number of cells in the set of memory cells associated with a given read threshold before and after an error correction decoding operation and comparing the respective numbers of cells.

33. The system of claim 32, wherein optimal performance occurs when the error evaluation circuit measures a difference between the numbers of cells counted before and after the error correction decoding operation that is less than a predetermined threshold and sub-optimal performance occurs when the error evaluation circuit measures a difference between the numbers of cells counted before and after the error correction decoding operation that is greater than a predetermined threshold.

34. The system of claim 24, wherein the offset circuit perturbs each individual read threshold separately.

35. The system of claim 24, wherein the offset circuit perturbs multiple read thresholds in parallel.

36. The system of claim 35, wherein the error evaluation circuit independently evaluates the performance of each of the multiple read thresholds separately and the offset circuit independently perturbs each of the multiple read thresholds according to their respective performances.

37. The system of claim 36, wherein the read circuit reads bits of a relatively lower level page corresponding to different potential error locations of a relatively higher level page to differentiates errors in the relatively higher level page.

38. The system of claim 24 comprising a read threshold history database that stores sets of read thresholds previously used to successfully read different sets of memory cells in the memory unit, wherein the memory controller retrieves the initial set of read thresholds from the read threshold history database and updates the read threshold history database by at least the perturbed set of read thresholds.

39. The system of claim 24, wherein the read circuit reads an Mth bit in the set of memory cells using a set of $2^{M-1}$ read thresholds or all bits in the set of memory cells in an N-bits per cell memory unit using a set of or $2^N-1$ read thresholds.

40. The system of claim 24, wherein the offset circuit iteratively tracks at least one potentially varying optimal read threshold voltage in each sequential read operation and iteratively perturbs the at least one read threshold to approximate the optimal voltage.

41. The system of claim 40, wherein the offset circuit tracks a single optimal read threshold voltage using multiple reading and decoding operations to perturb the one read threshold.

42. The system of claim 40, wherein the offset circuit tracks multiple optimal read threshold voltages using multiple reading and decoding operations to perturb multiple read thresholds.

43. A non-transient computer-readable medium, having instructions stored thereon, which when executed by a processor of a computer cause the computer to:
- receive a request to read information from a set of memory cells in the memory unit;
- perturb at least one read threshold in an initial set of read thresholds to generate a perturbed set of read thresholds;
- read the set of memory cells using the perturbed set of read thresholds to provide a read result; and
- evaluate the performance of said reading using the perturbed set of read thresholds.

* * * * *